United States Patent
Miyagawa et al.

(10) Patent No.: US 6,528,342 B2
(45) Date of Patent: Mar. 4, 2003

(54) SOLID STATE IMAGING APPARATUS, METHOD OF MANUFACTURING THE SAME AND VIDEO SYSTEM USING SUCH SOLID STATE IMAGING APPARATUS

(75) Inventors: Ryohei Miyagawa, Sagamihara (JP); Hirofumi Yamashita, Tokyo (JP); Michio Sasaki, Kamakura (JP); Eiji Oba, Kawasaki (JP); Nagataka Tanaka, Yokohama (JP); Keiji Mabuchi, Kitakami (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/885,071

(22) Filed: Jun. 21, 2001

(65) Prior Publication Data

US 2001/0032983 A1 Oct. 25, 2001

Related U.S. Application Data

(62) Division of application No. 08/933,306, filed on Sep. 18, 1997, now Pat. No. 6,281,533.

(30) Foreign Application Priority Data

Sep. 19, 1996 (JP) .............................. 8-248362

(51) Int. Cl.[7] .................. H01L 21/00; H01L 21/425
(52) U.S. Cl. ................ 438/79; 438/59; 438/527; 438/529
(58) Field of Search ............... 438/28, 79, 78, 438/98, 59, 448, 527, 528, 529, 439

(56) References Cited

U.S. PATENT DOCUMENTS

| | | | |
|---|---|---|---|
| 5,625,210 A | 4/1997 | Lee et al. | 257/292 |
| 5,880,495 A | 3/1999 | Chen | 257/233 |
| 5,895,243 A * | 4/1999 | Doan et al. | 438/297 |
| 5,898,196 A | 4/1999 | Hook et al. | 257/292 |
| 6,051,857 A | 4/2000 | Miida | 257/292 |
| 6,084,259 A | 7/2000 | Kwon et al. | 257/292 |

FOREIGN PATENT DOCUMENTS

| | | | |
|---|---|---|---|
| JP | 59130466 A * | 6/1984 | |
| JP | 59-130466 | 7/1984 | |
| JP | 61-97861 | 5/1986 | |
| JP | 62-123736 | 6/1987 | |
| JP | 2-54561 | 2/1990 | |
| JP | 402054561 A * | 2/1990 | |
| JP | 2-131681 | 5/1990 | |
| JP | 5-335407 | 12/1993 | |
| JP | 6-151579 | 5/1994 | |
| JP | 6-310702 | 11/1994 | |

* cited by examiner

*Primary Examiner*—John F. Niebling
*Assistant Examiner*—Viktor Simkovic
(74) *Attorney, Agent, or Firm*—Oblon, Spivak, McClelland, Maier & Neustadt, P.C.

(57) ABSTRACT

This invention prevents an end portion of the LOCOS region having a large number of defects of an MOS sensor from depletion and thereby reduces the leak current that occurs in the defects in the end portion of the LOCOS region. An n-type layer region is formed in a surface area of a p-type substrate for constituting a photodiode with the p-type layer. A LOCOS region is formed on a p$^+$-type layer in a surface area of the silicon substrate as device separation region by oxidizing part of the silicon substrate. The n-type layer region and the LOCOS region are separated from each other by a predetermined distance. A contact region is formed and separated from the n-type layer region by a distance equal to the size of the gate electrode of the read-out transistor of the MOS sensor. A wiring layer is connected to the contact region. Then, a planarizing layer is formed to cover the n-type layer region, the LOCOS region, the gate electrode and the wiring layer.

8 Claims, 18 Drawing Sheets

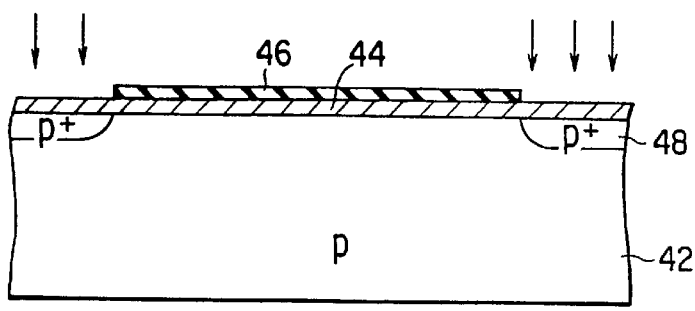
F I G. 5A
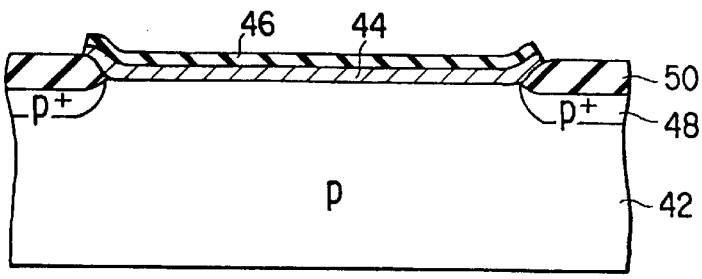
F I G. 5B
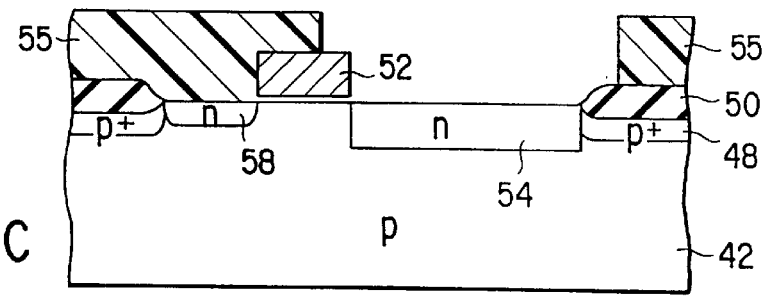
F I G. 5C
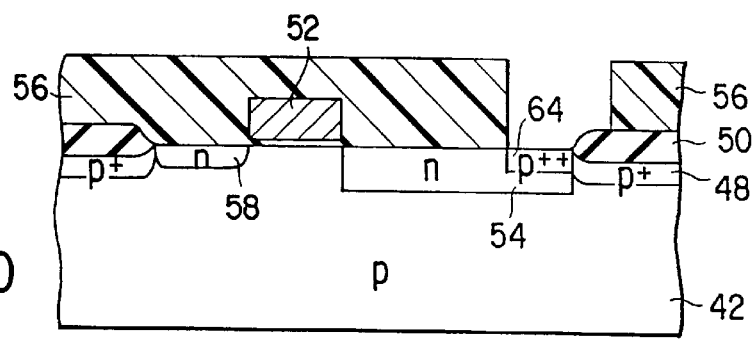
F I G. 5D
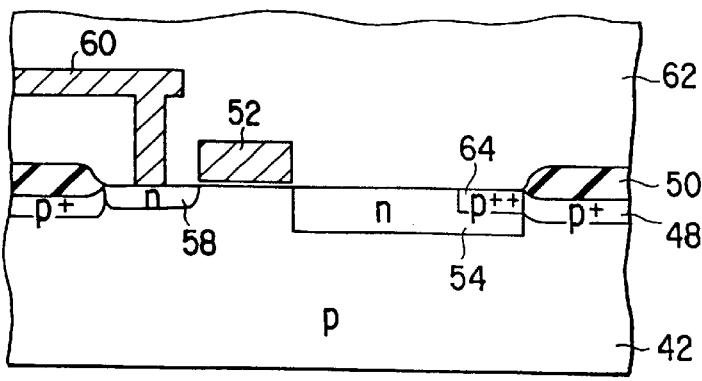
F I G. 5E

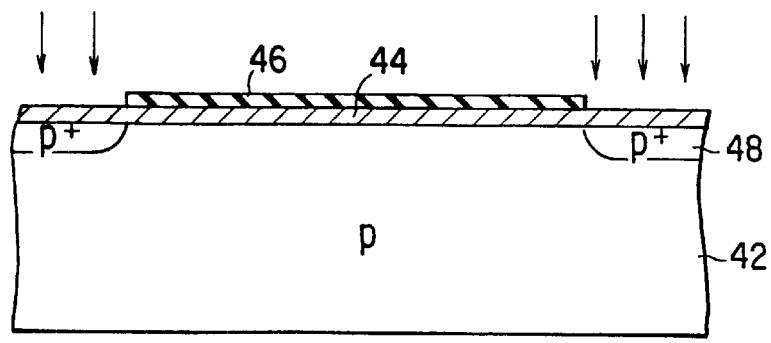
F I G. 6A
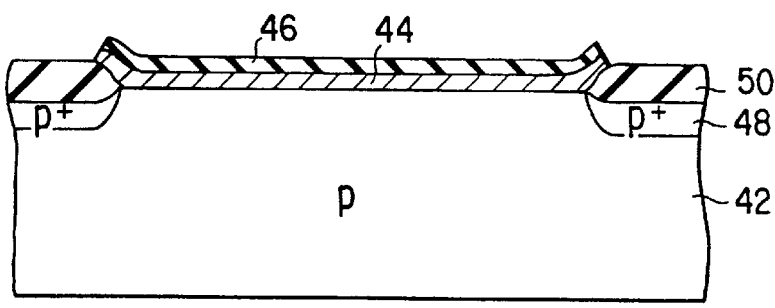
F I G. 6B
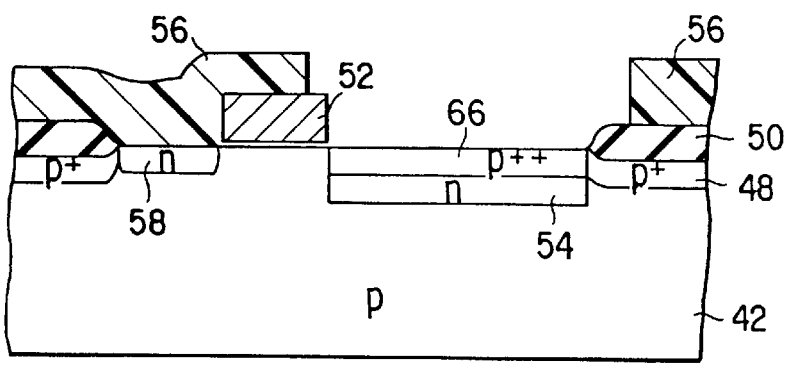
F I G. 6C
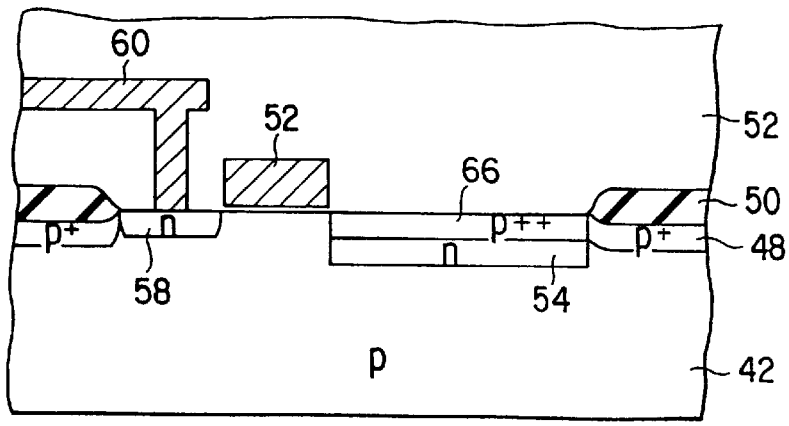
F I G. 6D

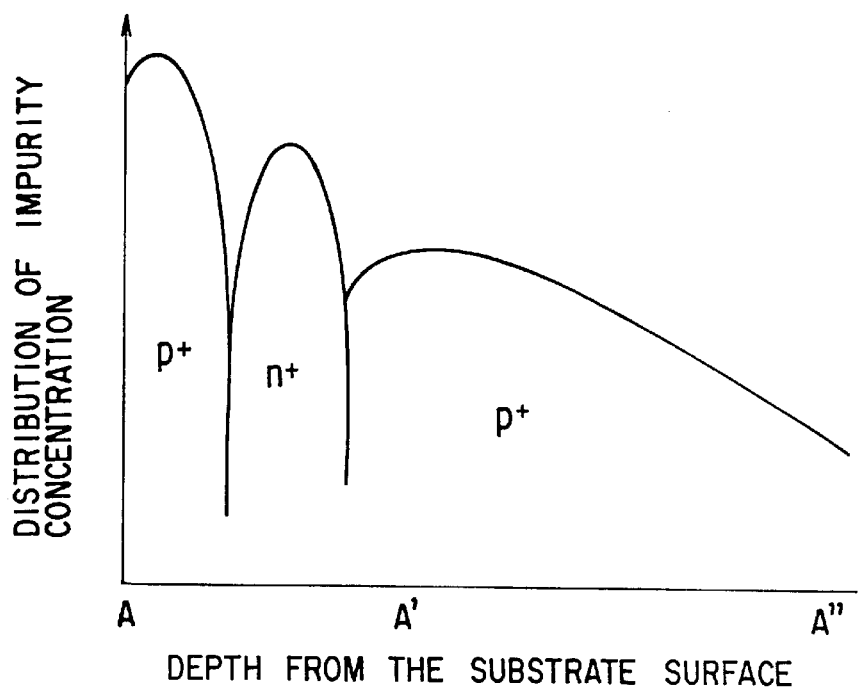
F I G. 12
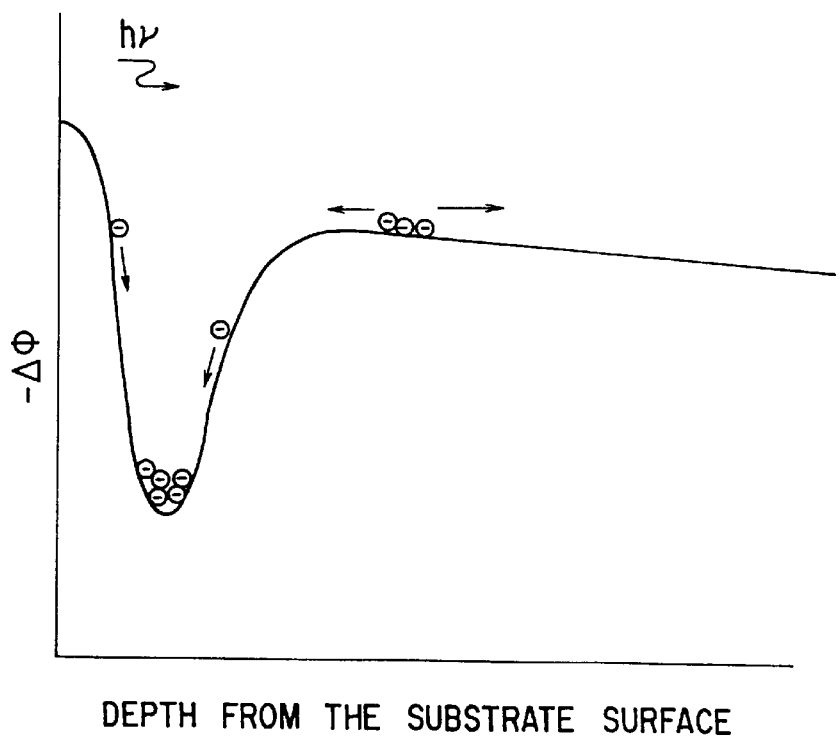
F I G. 13

INTRODUCTION OF PHOTOELECTRONS

ADDRESS LINE Ad" M"

RESET

ADDRESS LINE Ad" L"

AFTER RESET

ADDRESS LINE Ad" M"

SOLID STATE IMAGING APPARATUS, METHOD OF MANUFACTURING THE SAME AND VIDEO SYSTEM USING SUCH SOLID STATE IMAGING APPARATUS

BACKGROUND OF THE INVENTION

This invention relates to an amplifier type solid state imaging apparatus formed on a silicon substrate and, more particularly, it relates to a solid state imaging device wherein each unit cell has a photodiode processed for device separation by means of a silicon oxide film formed by oxidizing the silicon substrate. The present invention also relates to a solid state imaging apparatus wherein the semiconductor substrate of the apparatus has for each unit cell a region located at a position deeper than the depletion layer region operating as a photodiode, in which region the impurity concentration of the semiconductor slowly increases as a function of the depth in the substrate and part of the signal charges generated in the semiconductor substrate are collected by a signal storage to provide a high dynamic range. The present invention further provides a method of manufacturing such a solid state imaging apparatus and a video system realized by using such a solid state imaging apparatus.

Solid state imaging apparatuses comprising an amplifier type sensor have been developed in recent years. Such apparatuses are featured by detecting optical signals by means of a photoelectric converter/storage and amplifying them in the vicinity of the photoelectric converter/storage.

An amplifier type MOS sensor typically comprises in each unit pixels or unit cell thereof a photodiode and amplifying means including an amplifier transistor for amplifying the signal charges photoelectrically converted and collected by the photodiode in the silicon substrate.

FIG. 1 of the accompanying drawings schematically illustrates in cross section part of a unit cell of a known amplifier type MOS sensor. As seen from FIG. 1, an n-type layer region 12 that constitutes a photodiode with a silicon substrate (p-type layer region) 10 is formed in an oxide film for device separation in a self-aligning manner. A device separating region 16 arranged on a p$^+$-layer 14 is a silicon oxide film formed by oxidizing part of the silicon substrate 10, which silicon oxide film is normally referred to as LOCOS (LOCal Oxidation of Silicon). Reference numerals 18 and 20 in FIG. 1 denote respectively a contact region and a wiring layer connected to the contact region 18, whereas reference numerals 22 and 24 denote respectively the gate of a read-out transistor and a planarizing layer.

The silicon substrate 10 is apt to become defective at and near the corresponding end of the LOCOS region 16 due to the stress generated during the local oxidation. The defect, if any, by turn gives rise to an electric current that appears as leak current of the photodiode.

Now, this problem will be discussed by referring to FIG. 2 of the accompanying drawing.

FIG. 2 is an enlarged cross sectional view showing the boundary of the photodiode and the LOCOS region of FIG. 1. As shown in FIG. 2, a depletion region 26 is formed around the n-type layer region 12 and a depleted region with a large number of defects (multi-defect region) 28 is formed in a lower boundary area of the LOCOS region 16 located adjacent to the n-type layer region 12. Thus, a large number of electron/hole pairs will be generated by heat via the defect levels in the silicon band gap in the multi-defect regions. Then, electrons can transfer into the photodiode to appear as leak current of the photodiode, which leak current can reduce the sensitivity or the S/N ratio of the solid state imaging apparatus.

Thus, since a photodiode and a photodiode are formed in a self-aligning manner in known solid state imaging apparatus, they are accompanied by the problem of leak current on the part of the photodiode generated due to the defect at and near the corresponding end of the LOCOS region 16.

BRIEF SUMMARY OF THE INVENTION

Therefore, the object of the present invention is to provide a solid state imaging apparatus that can prevent any leak current from appearing in the photodiode and is resistive against degradation in the sensitivity, a method of manufacturing such a solid state imaging apparatus, and a video system using such a solid state imaging apparatus.

According to a first aspect of the invention, the above object is achieved by providing a solid state imaging apparatus comprising for each unit cell a substrate of a first conductivity type, at least a first impurity layer of a second conductivity type different from the first conductivity type formed in a surface area of the substrate for a photodiode for forming a photoelectric conversion region, a device separation region for the device separation of the photodiode, the device separation region having a second impurity layer formed in a lower area thereof, and means for amplifying the signal charges collected by the photodiode, wherein the first impurity layer is separated from the device separation region by a predetermined distance.

According to a second aspect of the invention, there is provided a solid state imaging apparatus comprising for each unit cell a substrate of a first conductivity type, at least a first impurity layer of a second conductivity type different from the first conductivity type formed in a surface area of the substrate for a photodiode for forming a photoelectric conversion region, a device separation region for the device separation of the photodiode, the device separation region having a second impurity layer formed in a lower area thereof, and means for amplifying the signal charges collected by the photodiode, wherein the first impurity layer is located adjacent to the second impurity layer and the apparatus further comprises for each unit cell a third impurity layer located adjacent to the second impurity layer and formed continuously at least in part with the surface area of the first impurity region, the third impurity layer having an impurity concentration greater than the second impurity layer.

According to a third aspect of the invention, there is provided a solid state imaging apparatus comprising for each unit cell a substrate of a first conductivity type, at least a first impurity layer of a second conductivity type different from the first conductivity type formed in a surface area of the substrate for a photodiode for forming a photoelectric conversion region, a device separation region for the device separation of the photodiode, the device separation region having a second impurity layer formed in a lower area thereof, and means for amplifying the signal charges collected by the photodiode, wherein the second impurity layer contains a third impurity layer of the first conductivity type located on the side of the first impurity layer and has an impurity concentration greater than the second impurity layer and the first impurity layer is located adjacent to the third impurity layer.

According to a fourth aspect of the invention, there is provided a method of manufacturing a solid state imaging apparatus comprising a first step of forming for each unit cell a first impurity layer in a surface area of a substrate of a first conductivity type by implanting ions of an impurity of a first conductivity type into the substrate to an impurity concentration level higher than the substrate, using a silicon nitride film formed on the substrate as a mask, a second step of forming a device separation region on the first impurity layer, a third step of forming a second impurity layer of a second conductivity type in a surface area of the substrate and a third impurity layer of the second conductivity type in another surface area of the substrate separated from the device separation region by a predetermined distance by implanting ions of an impurity of the second conductivity type different from the first conductivity type, using an electrode formed on the substrate and a resist layer formed on the substrate and the device separation region as a mask and a fourth step of forming a wiring layer on the second impurity layer after removing the resist layer.

According to a fifth aspect of the invention, there is provided a method of manufacturing a solid state imaging apparatus comprising a first step of forming for each unit cell a first impurity layer in a surface area of a substrate of a first conductivity type by implanting ions of an impurity of a first conductivity type into the substrate to an impurity concentration level higher than the substrate, using a silicon nitride film formed on the substrate as a mask, a second step of forming a device separation region on the first impurity layer, a third step of forming a second impurity layer of a second conductivity type in a surface area of the substrate and a third impurity layer of the second conductivity type in another surface area of the substrate adjacent to the device separation region by implanting ions of an impurity of the second conductivity type different from the first conductivity type, using an electrode formed on the substrate and a resist layer formed on the substrate and the device separation region as a mask, a fourth step of forming a fourth impurity layer by implanting ions of the impurity of the first conductivity type into part of the surface area of the third impurity layer adjacent to the first impurity layer to an impurity concentration level higher than the first impurity layer, using the electrode formed on the substrate and the resist layer formed on the substrate and the device separation region as a mask and a fifth step of forming a wiring layer on the second impurity layer after removing the resist layer.

According to a sixth aspect of the invention, there is provided a method of manufacturing a solid state imaging apparatus comprising a first step of forming for each unit cell a first impurity layer in a surface area of a substrate of a first conductivity type by implanting ions of an impurity of a first conductivity type into the substrate to an impurity concentration level higher than the substrate, using a silicon nitride film formed on the substrate as a mask, a second step of forming a device separation region on the first impurity layer, a third step of forming a second impurity layer of a second conductivity type in a surface area of the substrate and a third impurity layer of the second conductivity type in another surface area of the substrate adjacent to the device separation region by implanting ions of an impurity of the second conductivity type different from the first conductivity type, using an electrode formed on the substrate and a resist layer formed on the substrate and the device separation region as a mask, a fourth step of forming a fourth impurity layer by implanting ions of the impurity of the first conductivity type into a surface area of the third impurity layer to an impurity concentration level higher than the first impurity layer, using the electrode formed on the substrate and the resist layer formed on the substrate and the device separation region as a mask and a fifth step of forming a wiring layer on the second impurity layer after removing the resist layer.

According to a seventh aspect of the invention, there is provided a method of manufacturing a solid state imaging apparatus comprising a first step of forming for each unit cell a first impurity layer in a surface area of a substrate of a first conductivity type by implanting ions of an impurity of a first conductivity type into the substrate to an impurity concentration level higher than the substrate, using a silicon nitride film formed on the substrate as a mask, a second step of forming a device separation region on the first impurity layer, a third step of forming a second impurity layer of a second conductivity type in a surface area of the substrate and a third impurity layer of the second conductivity type in another surface area of the substrate separated from the device separation region by a predetermined distance by implanting ions of an impurity of the second conductivity type different from the first conductivity type, using an electrode formed on the substrate and a resist layer formed on the substrate and the device separation region as a mask, a fourth step of forming a fourth impurity layer by implanting ions of the impurity of the first conductivity type into a surface area of the third impurity layer and a surface area of the substrate adjacent to the first impurity layer to an impurity concentration level higher than the first impurity layer, using the electrode formed on the substrate and the resist layer formed on the substrate and the device separation region as a mask and a fifth step of forming a wiring layer on the second impurity layer after removing the resist layer.

According to an eight aspect of the invention, there is provided a method of manufacturing a solid state imaging apparatus comprising a first step of forming for each unit cell a first impurity layer in a surface area of a substrate of a first conductivity type by implanting ions of an impurity of a first conductivity type into the substrate to an impurity concentration level higher than the substrate, using a silicon nitride film formed on the substrate as a mask, a second step of forming a second impurity layer by implanting ions of the impurity of the first conductivity type into a surface area of the substrate adjacent to the first impurity layer to a concentration level higher than the first impurity layer, using the silicon nitride film and a resist layer formed on part of the first impurity layer as a mask, a third step of forming a device separation region on the first impurity layer, a fourth step of forming a third impurity layer of a second conductivity type in a surface area of the substrate and a fourth impurity layer of the second conductivity type in another surface area of the substrate adjacent to the device separation region by implanting ions of an impurity of the second conductivity type different from the first conductivity type, using an electrode formed on the substrate and a resist layer formed on the substrate and the device separation region as a mask and a fifth step of forming a wiring layer on the second impurity layer after removing the resist layer.

According to a ninth aspect of the invention, there is provided a method of manufacturing a solid state imaging apparatus comprising a first step of forming for each unit cell a first impurity layer in a surface area of a substrate of a first conductivity type by implanting ions of an impurity of a first conductivity type into the substrate to an impurity concentration level higher than the substrate, using a silicon nitride film formed on the substrate as a mask, a second step of forming a device separation region on the first impurity layer, a third step of forming a second impurity layer of a second conductivity type in a surface area of the substrate and a third impurity layer of the second conductivity type in another surface area of the substrate separated from the device separation region by a predetermined distance by implanting ions of an impurity of the second conductivity type different from the first conductivity type, using an electrode formed on the substrate and a resist layer formed on the substrate and the device separation region as a mask, a fourth step of forming a fourth impurity layer by implanting ions of the impurity of the first conductivity type into part of the surface area of the third impurity layer adjacent to the first impurity layer to an impurity concentration level higher than the first impurity layer, using the electrode and the resist layer formed on the substrate and the device separation region as a mask and a fifth step of forming a wiring layer on the second impurity layer after removing the resist layer.

According to a tenth aspect of the invention, there is provided a video system comprising an optical system for taking an optical image of a scene and leading the optical image to a predetermined location, an imaging means comprising an array of pixels, each having at least a photodiode region for a photoelectric conversion, a device separation region for the device separation of the photodiode and means for amplifying the signal charges collected by the photodiode, for photoelectrically transforming the optical image led to the predetermined location into an electric signal representing the quantity of light of the optical image on a pixel by pixel basis and signal processing means for storing the electric signal produced by the photoelectric transformation by the imaging means, wherein the imaging means comprises for each cell a device separation region for the device separation of the photodiode, the device separation region being provided with a first impurity layer of a first conductivity type formed in a lower area thereof and a second impurity layer of a second conductivity type different from the first conductivity type formed in a surface area of the substrate of the first conductivity type separated from the device separation region by a predetermined distance.

According to an eleventh aspect of the invention, there is provided a video system comprising an optical system for taking an optical image of a scene and leading the optical image to a predetermined location, an imaging means comprising an array of pixels, each having at least a photodiode region for a photoelectric conversion, a device separation region for the device separation of the photodiode and means for amplifying the signal charges collected by the photodiode, for photoelectrically transforming the optical image led to the predetermined location into-an electric signal representing the quantity of light of the optical image on a pixel by pixel basis and signal processing means for storing the electric signal produced by the photoelectric transformation by the imaging means, wherein the imaging means comprises for each cell a device separation region for the device separation of the photodiode, the device separation region being provided with a first impurity layer of a first conductivity type formed in a lower area thereof, a second impurity layer of a second conductivity type different from the first conductivity type formed in a surface area of the substrate of the first conductivity type and a third impurity layer of the first conductivity type at least in part of the surface area of the second impurity layer and having an impurity concentration greater higher than the first impurity layer.

According to a twelfth aspect of the invention, there is provided a video system comprising an optical system for taking an optical image of a scene and leading the optical image to a predetermined location, an imaging means comprising an array of pixels, each having at least a photodiode region for a photoelectric conversion, a device separation region for the device separation of the photodiode and means for amplifying the signal charges collected by the photodiode, for photoelectrically transforming the optical image led to the predetermined location into an electric signal representing the quantity of light of the optical image on a pixel by pixel basis and signal processing means for storing the electric signal produced by the photoelectric transformation by the imaging means, wherein the imaging means comprises for each cell a device separation region for the device separation of the photodiode, the device separation region being provided with a first impurity layer of a first conductivity type having an impurity concentration higher than the first impurity layer formed in a lower area thereof and a third impurity layer of a second conductivity type different from the first conductivity type formed adjacently relative to the second impurity layer in a surface area of the substrate of the first conductivity type.

According to the invention, the photodiode is separated from the corresponding end of the LOCOS region containing a large number of defects therein, which is made to show a high concentration level of an impurity having an conductivity type opposite to that of the photodiode.

According to the invention, the conventional completely depleted structure of the photodiode is modified within an area where incident light is absorbed and attenuated but remains effective so as to arrange a completely depleted region and an undepleted signal storage region within the effective stroke of incident light and provide the impurity concentration of the undepleted semiconductor impurity layer with a gradient slowly rising toward the adjacent pixel or the bottom of the substrate so that the signal charges generated in the undepleted region are encouraged to transfer into the storage side due to the concentration gradient and become distributed and only part of the signal charges may be stored.

According to the invention, the impurity concentration of the impurity semiconductor surrounding the photodiode is provided with a mild gradient to effectively collect the signal charges obtained by the photoelectric conversion of incident light and discard part of the large volume of signals generated by very bright light as waste.

According to the invention, the impurity concentration of the semiconductor substrate with a gradient slowly rising as a function of the depth of the substrate in an area located below the depleted region of the photodiode to effectively collect the signal charges obtained by the photoelectric conversion of incident light. As a result, only part of the signal charges generated by very bright light may be stored, the rest being discharged to the substrate side by diffusion to realize a high dynamic range.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5A through 5E are cross sectional views of a second embodiment of solid state imaging apparatus according to the invention and comprising an amplifier type MOS sensor that comprises a photodiode in each unit cell, the second embodiment being shown in different manufacturing steps.

FIGS. 6A through 6D are cross sectional views of a third embodiment of solid state imaging apparatus according to the invention and comprising an amplifier type MOS sensor that comprises a photodiode in each unit cell, the third embodiment being shown in different manufacturing steps.

FIG. 12 is a graph schematically illustrating the relationship between the depth from the substrate surface and the impurity concentration of the photodiode of another typical solid state imaging apparatus.

FIG. 13 is a graph schematically illustrating the relationship between the depth from the substrate surface and the electric potential of the photodiode of a still another typical solid state imaging apparatus.

DETAILED DESCRIPTION OF THE INVENTION

Figure 1:
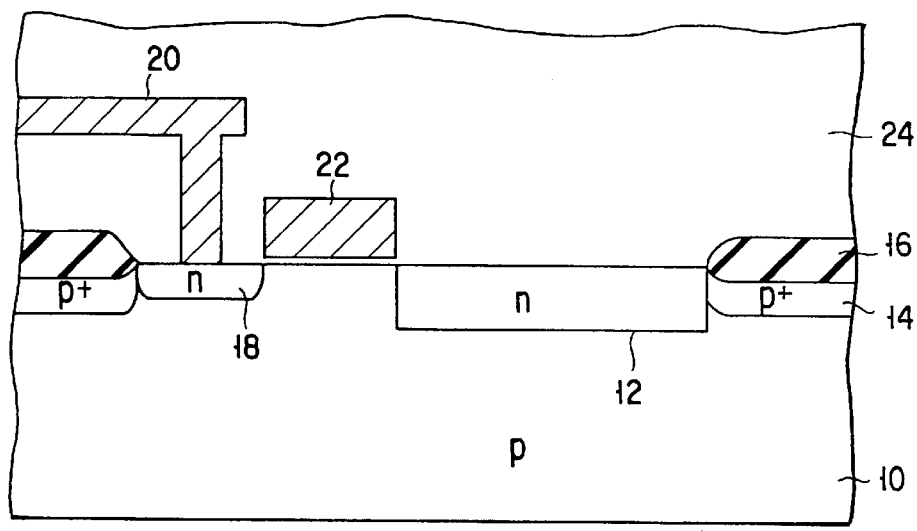
FIG. 1 is a schematic cross sectional view of a unit cell of a known amplifier type MOS sensor, including a photodiode.

Now, the present invention will be described in greater detail by referring to the accompanying drawing that illustrates preferred embodiments of the invention.

Throughout the drawing, the same or similar components are denoted respectively by the same reference numerals and will not be described repeatedly.

Figure 3:
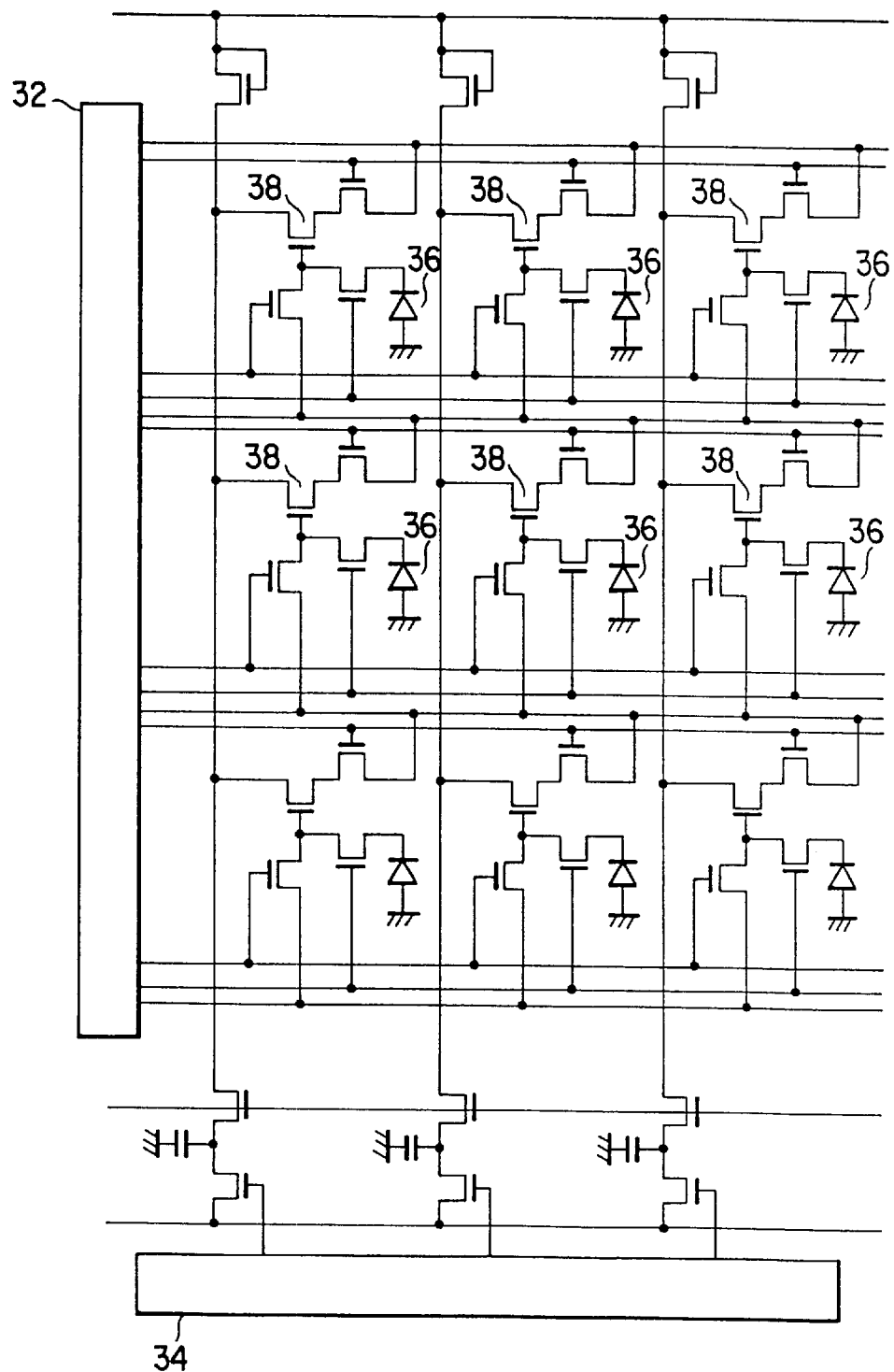
FIG. 3 is a schematic circuit diagram of a typical solid state imaging apparatus comprising an amplifier type MOS sensor.

FIG. 3 is a schematic circuit diagram of a typical solid state imaging apparatus comprising an amplifier type MOS sensor.

Referring to FIG. 3, the amplifier type MOS sensor is connected to a vertical shift register 32 and a horizontal shift register 34 and comprises in each unit pixel or unit cell at least a photodiode 36 and amplifying means including an amplifier transistor 38 for amplifying the signal charges photoelectrically converted and collected in the silicon substrate of the sensor.

FIGS. 4A through 4D are cross sectional views of a first embodiment of solid state imaging apparatus according to the invention and comprising an amplifier type MOS sensor that comprises a photodiode in each unit cell, the first embodiment being shown in different manufacturing steps in these views.

Figure 4A:
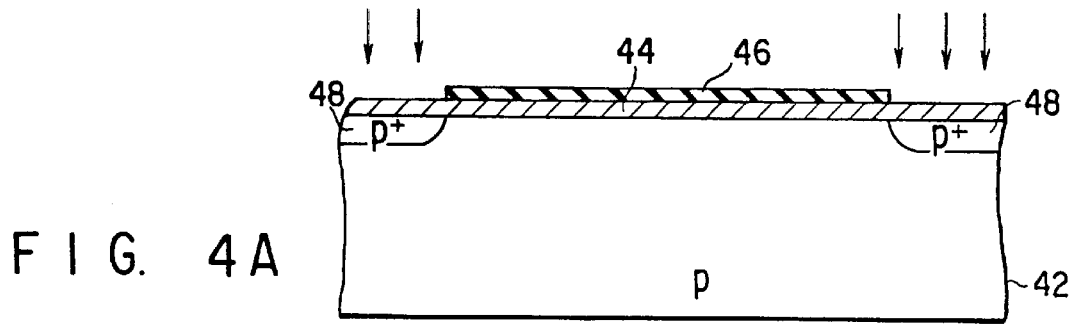
FIGS. 4A through 4D are cross sectional views of a first embodiment of solid state imaging apparatus according to the invention and comprising an amplifier type MOS sensor that comprises a photodiode in each unit cell, the first embodiment being shown in different manufacturing steps in these views.

Referring to FIG. 4A, an oxide film 44 and a silicon nitride film 46 are formed on a silicon substrate (p-type layer region) 42. Then, ions of an impurity substance are implanted into the silicon substrate 42, using the silicon nitride film 46 as a mask to produce a $p^+$-layer 48 having an impurity concentration greater than the silicon substrate 42 on a surface are of the substrate 42.

Figure 4B:
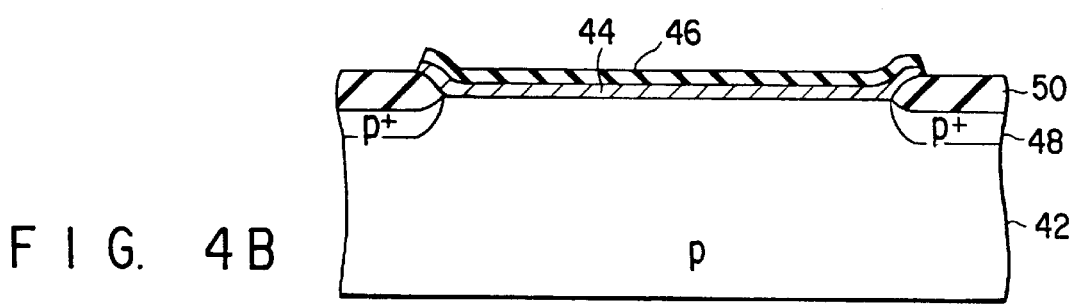

Then, as shown in FIG. 4B, a LOCOS region 50 is formed as device separating region on the p+-layer 48 by oxidizing part of the silicon substrate 42.

Figure 4C:
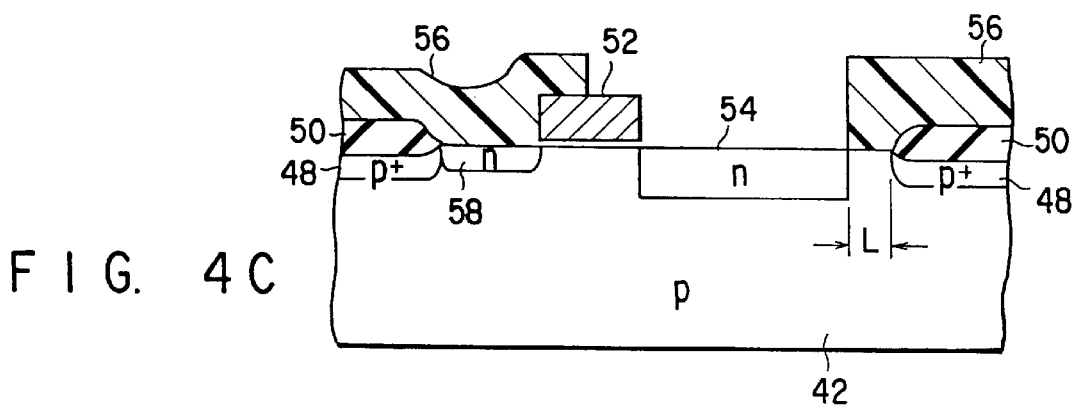

Thereafter, as shown in FIG. 4C, a gate electrode 52 of read-out transistor is formed on the substrate 42. Subsequently, resist is applied to the surface of the substrate 42 to produce a resist layer 56 except the area for forming an n-type layer region 54. Note that the resist layer 56 is positionally so arranged that the space separating the oppositely disposed ends of the LOCOS region 50 and the n-type layer region 54 shows a predetermined distance L as seen from FIG. 4C. Then, an n-type impurity is ion-implanted into the substrate 42, by using the gate electrode 52 and the resist layer 56 as a mask. The impurity is diffused by heat treatment after the exfoliation of the resist layer 56, forming an n-type layer region 54 on the surface of the substrate 42. The substrate 42 and the region 54 constitute a photodiode. Then, an n-type contact region 58 is formed in a similar manner.

Note that the n-type layer region 54 and the contact region 58 are separated from each other by a distance equal to the size of the gate electrode 52 of the read-out transistor.

Figure 4D:
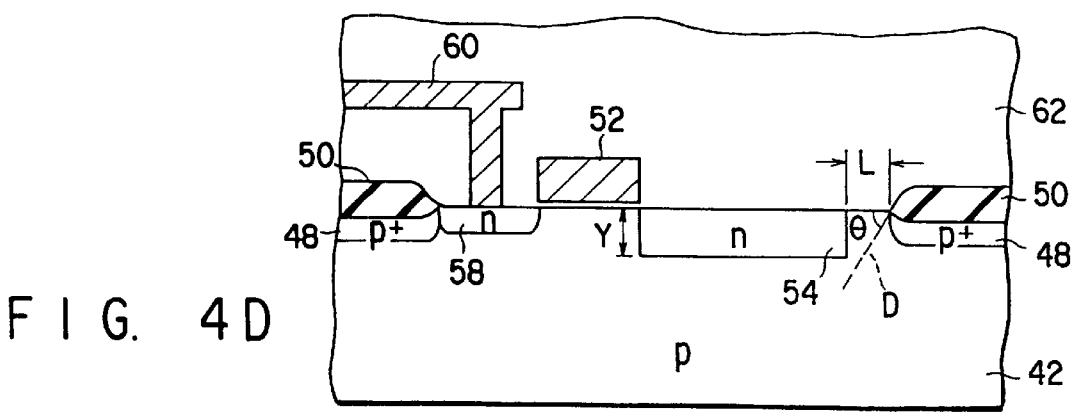

Thereafter, as shown in FIG. 4D, a wiring layer 60 is formed and connected to the contact region 58 and, at the same time, a planarizing layer 62 is formed on the substrate 42.

Thus, this embodiment differs from any comparable known devices in that the n-type layer region 54 constituting a photodiode is not formed in the LOCOS region in a self-aligning manner. With the above described conventional practice, a photodiode is formed in the LOCOS region in a self-aligning manner by implanting ions of an n-type impurity substance, using the LOCOS region itself as mask. With this embodiment, on the other hand, a resist layer 56 is formed in an area covering the LOCOS region 50 and a photodiode is produced by implanting ions of an n-type impurity substance.

Therefore, the n-type layer region 54 of the photodiode can be separated by a predetermined distance of L from the LOCOS region 50 in terms of the oppositely disposed ends thereof so that the multi-defect region produced at the end of the LOCOS region 50 is protected against depletion and hence any leak current due to the defect at the end of the LOCOS region 50 can be effectively prevented from occurring.

Note that the leak current that can appear at the end of the LOCOS region 50 can be remarkably reduced when the distance L separating it from the corresponding end of the photodiode (n-type layer region) 54 is greater than 0.1 µm.

Additionally, it has been found that the defects D in the multi-defect region produced at the end of the LOCOS region 50 extend downwardly with a certain angle (about 59°) from the end of the LOCOS region 50. Thus, if the angle with which defects D extend from the surface of the substrate 42 is θ and the distance from the end of the LOCOS region 50 to the corresponding end of the n-type layer region 54 is L, while the depth of the n-type layer region 54 from the surface of substrate 42 is Y, the distances L and Y may be selected to satisfy the following formula.

$Y < L \tan \theta$

In other words, the multi-defect region can be protected against depletion and a leak current due to the defect at the end of the LOCOS region 50 can be prevented from occurring by selecting the distance L separating the LOCOS region 50 and the n-type layer region 54 and the depth Y of the n-type layer region 54 from the surface of the substrate so as to meet the above relationship.

Now, a second embodiment of the invention will be described.

FIGS. 5A through 5E are cross sectional views of a second embodiment of solid state imaging apparatus according to the invention and comprising an amplifier type MOS sensor that comprises a photodiode in each unit cell, the second embodiment being shown in different manufacturing steps in these views.

This embodiment differs from the above described first embodiment in that the n-type layer region 54 of the photodiode and the LOCOS region 50 of the embodiment are not separated from each other but a p++-type defect shielding layer is formed on the n-type layer region 54 of the photodiode and arranged in contact with the end of the LOCOS region 50, the p++-type layer containing a p-type impurity substance to an enhanced concentration.

The manufacturing steps shown in FIGS. 5A and 5B are identical with those of FIGS. 4A and 4B and hence will not be described here any further.

Referring to FIG. 5C, after forming a gate electrode 52 of read-out transistor on the substrate 42, resist is applied to the surface of the substrate to form a resist layer 55. Then, ions of an n-type impurity substance are implanted into the substrate, using the gate electrode 52 and the resist layer 55 as mask. After the exfoliation of the resist layer 55, the device is heat treated to diffuse the implanted ions in order to produce an n-type layer region 54 on the surface of the substrate 42. An n-type contact region 58 is formed in a similar manner.

Then, as shown in 5D, a resist layer 56 is formed by applying resist to the surface of the substrate except the area for forming a defect shielding layer 64 that is a p++-type layer having an impurity concentration level higher than the p+-type layer 48. Under this condition, ions of a p-type impurity substance are implanted into the substrate, using the resist layer 56 and the LOCOS region 50 as mask and then a p++-type defect shielding layer 64 is produced in a self-aligning manner when the device is subjected to heat treatment.

Thereafter, as shown in FIG. 5E, a wiring layer 60 is formed and connected to the contact region 58 and, at the same time, a planarizing layer 62 is formed on the substrate 42.

In this second embodiment, the multi-defect region at the end of the LOCOS region 50 is protected against depletion and a leak current due to the defect at the end of the LOCOS region 50 is prevented from occurring by forming a p++-type defect shielding layer having an enhanced impurity concentration level at the end of the LOCOS region 50.

FIGS. 6A through 6D are cross sectional views of a third embodiment of solid state imaging apparatus according to the invention and comprising an amplifier type MOS sensor that comprises a photodiode in each unit cell, the third embodiment being shown in different manufacturing steps in these views.

This embodiment differs from the above described second embodiment in that a p++-type defect shielding layer is formed to cover the entire surface of the n-type layer region 17 of the photodiode.

The manufacturing steps shown in FIGS. 6A and 6B are identical with those of FIGS. 4A and 4B and hence will not be described here any further.

As in the case of FIG. 5C of the second embodiment, after forming a gate electrode 52 of read-out transistor, resist is applied to the surface of the substrate to produce a resist layer 56.

Then, as shown in FIG. 6C, ions of an n-type impurity substance and those of a p-type impurity substance are implanted, using the gate electrode 52, the resist layer 56 and part of the LOCOS region 50. After the exfoliation of the resist layer 56, the implanted ions are diffused into the substrate by heat treatment to produce an n-type layer region 56 and a $p^{++}$-type defect shielding layer in a surface area of the substrate 42. Then, an n-type contact region 58 is formed in a similar manner.

For the purpose of the invention, ions of the n-type impurity substance may be implanted and heat treated before implanting and heat treating those of the p-type impurity substance or vice versa, although implanted ions have to be accelerated in such a controlled manner that an n-type layer region 54 is formed under a $p^{++}$-type defect shielding layer 66.

Then, as shown in FIG. 6D, a wiring layer 60 is formed and connected to the contact region 58 and, at the same time, a planarizing layer 62 is formed on the substrate 42.

In this embodiment, a defect shielding layer 66 is formed on the entire surface of the n-type layer region 54 of the photodiode to prevent any leak current from occurring by way of the interface level of the silicon substrate 42 and the oxide film surface by extending the defect shielding layer 66 of the LOCOS region 50 over the entire surface of the n-type layer region for the interface level.

Thus, in this third embodiment, the multi-defect region at the end of the LOCOS region 50 is protected against depletion and a leak current due to the defect at the end of the LOCOS region 50 is prevented from occurring by forming a $p^{++}$-type defect shielding layer having an enhanced impurity concentration level at the end of the LOCOS region 50 as in the case of the above described second embodiment.

FIGS. 7A through 7E are cross sectional views of a fourth embodiment of solid state imaging apparatus according to the invention and comprising an amplifier type MOS sensor that comprises a photodiode in each unit cell, the fourth embodiment being shown in different manufacturing steps in these views.

Figure 7A:
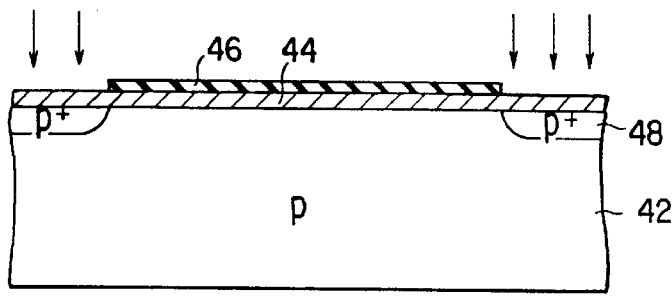
FIGS. 7A through 7E are cross sectional views of a fourth embodiment of solid state imaging apparatus according to the invention and comprising an amplifier type MOS sensor that comprises a photodiode in each unit cell, the fourth embodiment being shown in different manufacturing steps.
Figure 7B:
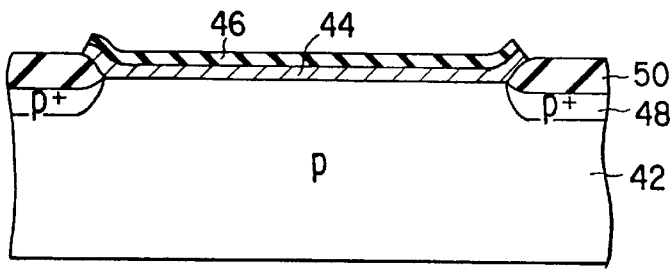

This fourth embodiment has a configuration substantially same as the above described third embodiment. Thus, the manufacturing steps shown in FIGS. 7A and 7B are identical with those of FIGS. 4A and 4B and hence will not be described here any further.

Figure 7C:
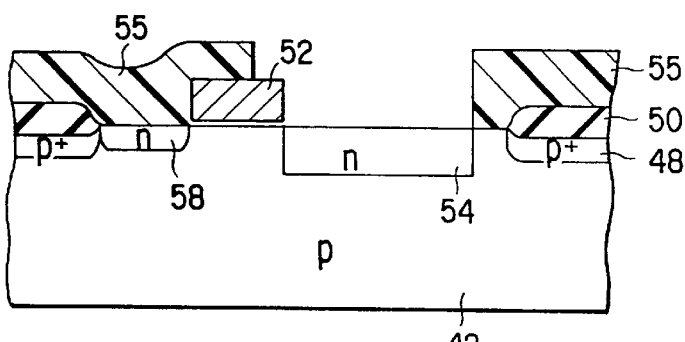

Referring to FIG. 7C, after forming a gate electrode 52 of read-out transistor on the substrate 42, resist is applied to the surface of the substrate to form a resist layer 55. Then, ions of an n-type impurity substance are implanted into the substrate, using the gate electrode 52 and the resist layer 55 as mask.

Figure 7D:
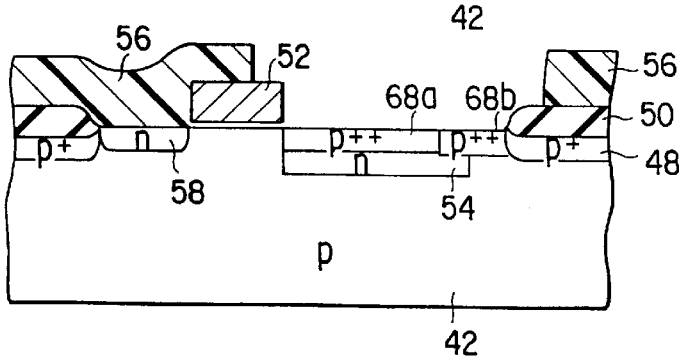

Thereafter, as shown in FIG. 7D, ions of a p-type impurity substance are implanted, using the gate electrode 52, the resist layer 56 and part of the LOCOS region 50. After the exfoliation of the resist layer 56, the device is heat treated to diffuse the implanted ions in order to produce an n-type layer region 54 on the surface of the substrate 42. Thus, a $p^{++}$-type layer 68a and a $p^{++}$-type defect shielding layer 68b are formed to shield the interface level. Then, an n-type layer region 54 is formed under the $p^{++}$-type layer 68a and the $p^{++}$-type defect shielding layer 68b. An n-type contact region 58 is formed in a similar manner.

Note that the n-type layer region 54 and the LOCOS region 50 are separated by a predetermined distance. The heat treatment after the impurity ion implantation may be conducted not separately but simultaneously for the n-type layer region 54, the $p^{++}$-type layer 68a and the $p^{++}$-type defect shielding layer 68b.

Figure 7E:
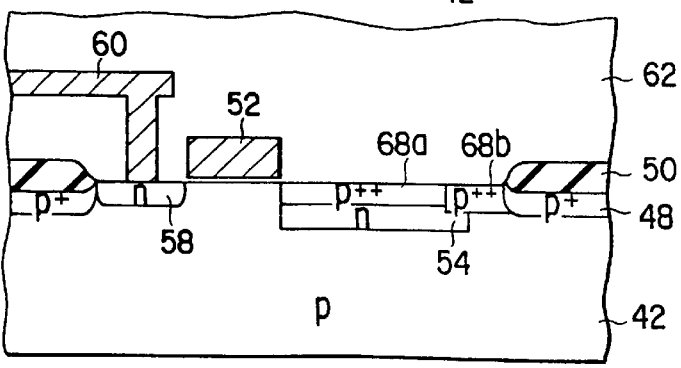

Then, as shown in FIG. 7E, a wiring layer 60 is formed and connected to the contact region 58 and, at the same time, a planarizing layer 62 is formed on the substrate 42.

Thus, this fourth embodiment differs from the third embodiment in that, firstly, the $p^{++}$-type layer 68a of the photodiode is separated from the end of the LOCOS region 50 as in the case of the first embodiment and, secondly, a defect shielding layer 68b is formed independent of the $p^{++}$-type layer 68a for shielding the interface level. The $p^{++}$-type layer 68b located adjacent to the LOCOS region 50 is preferably deeper than the $p^{++}$-type layer 68a, although the two $p^{++}$-type layers may alternatively have a same depth.

The ion implanting and heat treating operation may be conducted simultaneously or sequentially for the $p^{++}$-type layer 68a and for the $p^{++}$-type layer 68b.

In this fourth embodiment, the multi-defect region at the end of the LOCOS region 50 is protected against depletion and a leak current due to the defect at the end of the LOCOS region 50 is prevented from occurring by forming a $p^{++}$-type defect shielding layer having an enhanced impurity concentration level at the end of the LOCOS region 50 and separating the n-type layer region 54 of the photodiode from the end of the LOCOS region 50.

FIGS. 8A through 8F are cross sectional views of a fifth embodiment of solid state imaging apparatus according to the invention and comprising an amplifier type MOS sensor that comprises a photodiode in each unit cell, the fifth embodiment being shown in different manufacturing steps in these views. This fifth embodiment has a configuration substantially same as the above described second embodiment.

Figure 8A:
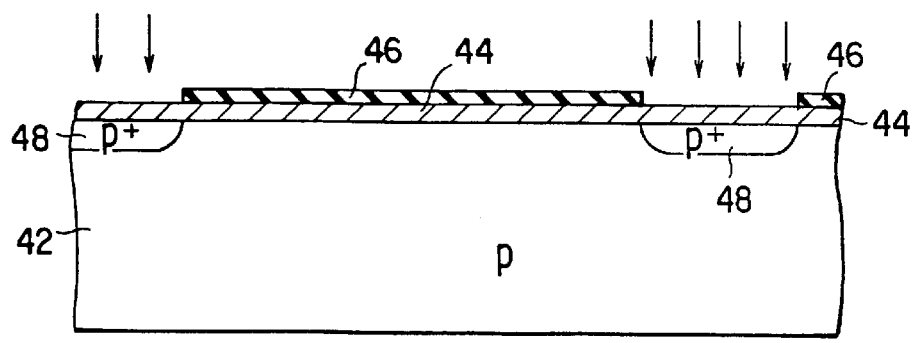
FIGS. 8A through 8F are cross sectional views of a fifth embodiment of solid state imaging apparatus according to the invention and comprising an amplifier type MOS sensor that comprises a photodiode in each unit cell, the fifth embodiment being shown in different manufacturing steps.

Referring to FIG. 8A, an oxide film 44 and a silicon nitride film 46 are formed on a p-type silicon substrate 42. Then, ions of an impurity substance are implanted into the silicon substrate 42, using the silicon nitride film 46 as a mask to produce a $p^+$-layer 48 having an impurity concentration greater than the silicon substrate 42 on a surface area of the substrate 42.

Figure 8B:
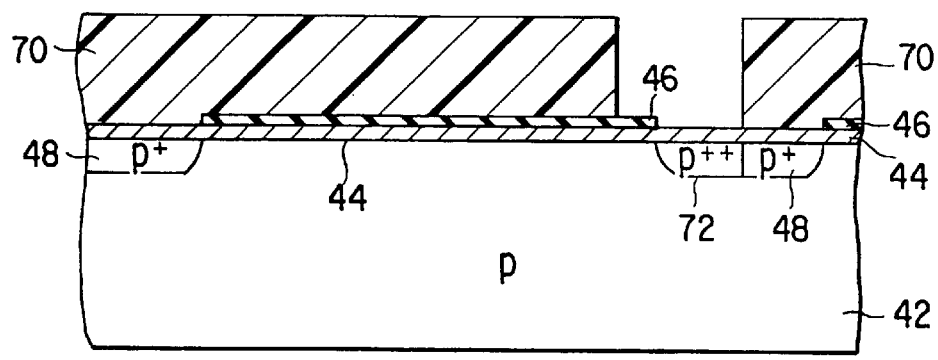

Then, as shown in FIG. 8B, resist is applied to the surface of the $p^+$-type layer 48 and the silicon nitride film 46 to produce a resist layer 70. Then, impurity ions are implanted, using the silicon nitride film 46 and the resist layer 70 as mask and subsequently, the resist layer 70 is exfoliated.

Figure 8C:
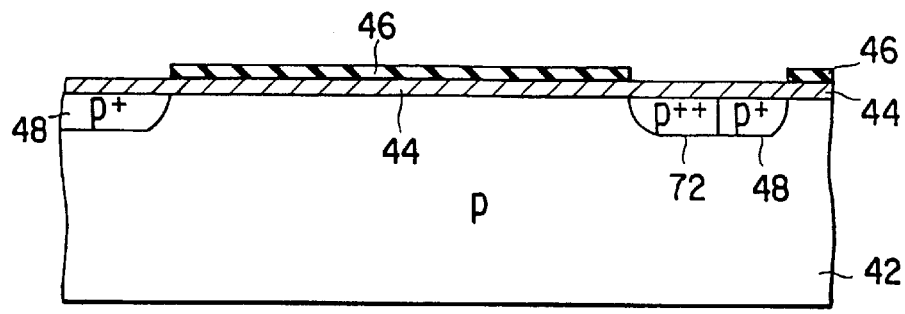

Then, as shown in FIG. 8C the device is heat treated to produce a $p^{++}$-type defect shielding layer 72 adjacent to the $p^+$-type layer 48.

Thereafter, a LOCOS region 50 is formed as device separating region on the $p^+$-layer 48 and the $p^{++}$-type defect shielding layer 72 by oxidizing part of the silicon substrate 42. Then, as in the case of FIG. 4C illustrating the first embodiment, a gate electrode 52 of read-out transistor is formed on the substrate 42. Subsequently, resist is applied to the surface of the substrate 42 to produce a resist layer 56.

Figure 8D:
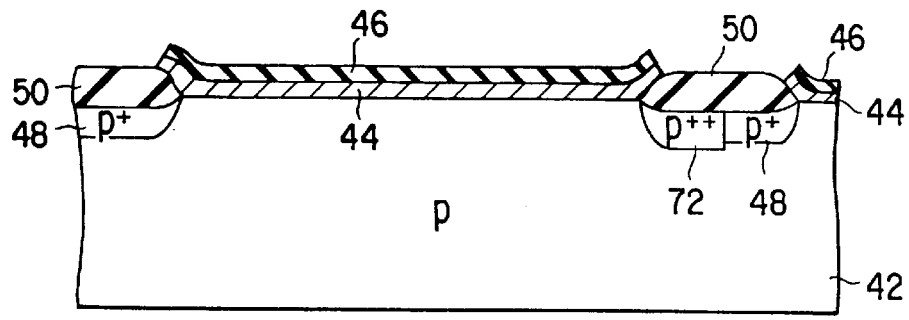
Figure 8E:
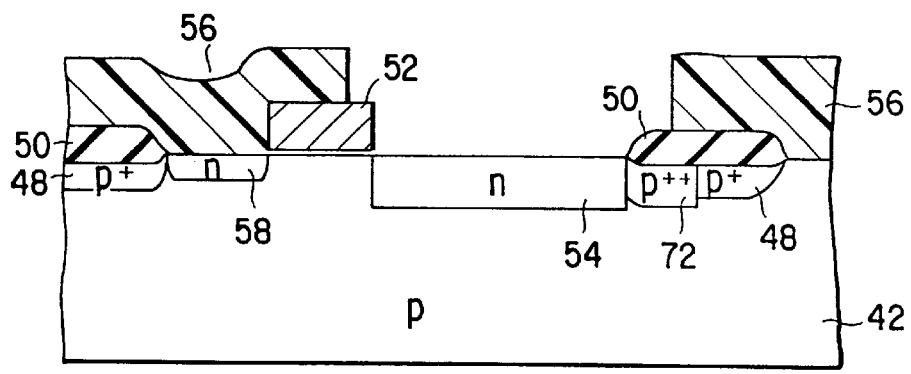

Then, as shown in FIG. 8E, ions of an n-type impurity substance are implanted, using the gate electrode 52, the resist layer 56 and the LOCOS region 50 as mask. After the exfoliation of the resist layer 55, the device is heat treated to diffuse the implanted ions in order to produce an n-type layer region 54 on the surface of the substrate 42. An n-type contact region 58 is formed in a similar manner.

Figure 8F:
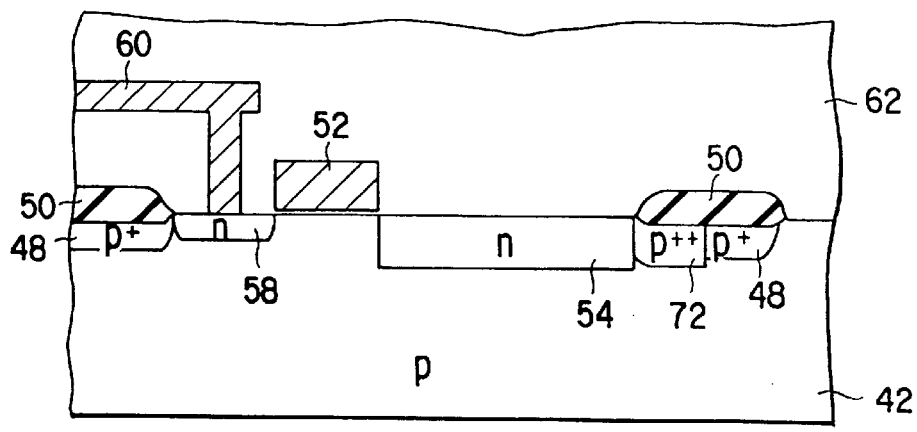

Thereafter, as shown in FIG. 8F, a wiring layer 60 is formed and connected to the contact region 58 and, at the same time, a planarizing layer 62 is formed on the substrate 42.

Thus, while a $p^{++}$-type defect shielding layer 64 is formed outside the LOCOS region 50 at the end of the latter in the second embodiment, a corresponding $p^{++}$-type defect shielding layer 72 is formed under the LOCOS region 50 at an end portion of the latter.

Normally, a silicon nitride film 46 is firstly formed in an area outside that of the LOCOS region 50 and then the LOCOS region 50 is formed by oxidizing the silicon substrate 42 with oxygen or H$_2$O at high temperature, using the silicon nitride film 46 as a mask. It operates as device separating region and a device separating layer that is a p$^+$-type layer is formed by implanting ions of a p-type impurity substance, using the silicon nitride film 46 as a mask, before oxidizing the silicon substrate 42.

However, in this fifth embodiment, the p$^{++}$-type defect shielding layer 72 is formed-by implanting ions of a p-type impurity substance, using the silicon nitride film 46 as mask, before oxidizing the silicon substrate 42 as in the case of forming the p$^+$-type device separating layer except that, unlike forming the p$^+$-type device separating layer 72, part of the area for forming the LOCOS region other than a given portion thereof located adjacent to the photodiode is covered not by the silicon nitride film but by the resist layer 70 so that consequently, a LOCOS region having a profile as shown in FIG. 8D is formed by implanting ions of the p-type impurity substance, using both the resist layer 70 and the silicon nitride film 46 as mask.

Again, the multi-defect region at the end of the LOCOS region 50 is protected against depletion and a leak current due to the defect at the end of the LOCOS region 50 is prevented from occurring because of the p$^{++}$-type layer containing the impurity substance to an enhanced concentration and arranged at the end of the LOCOS region.

It will be appreciated that the concentration of the p-type impurity substance of the p$^+$-type device separating layer is not raised in a simple manner to prevent a leak current of the photodiode from flowing through the LOCOS region of this fifth embodiment because, if the concentration of the p-type impurity substance of the p$^+$-type device separating layer is raised in a simple manner, areas other than the photodiode including the n-type layer region 54 shown in FIG. 8F can be eroded by the impurity substance diffused from the p$^{++}$-type layer that contains the substance at a high concentration level and, in an extreme case, the p-type layer can reach the contact region 58 to give rise to a leak current there. Therefore, a p$^{++}$-type defect shielding layer 72 is preferably formed in an area directly adjacent to the photodiode as in the case of this fifth embodiment.

Now, a sixth embodiment of the invention will be described.

FIGS. 9A through 9E are cross sectional views of a sixth embodiment of solid state imaging apparatus according to the invention and comprising an amplifier type MOS sensor that comprises a photodiode in each unit cell, this embodiment being shown in different manufacturing steps in these views.

This embodiment differs from the second embodiment in that the n-type layer region 54 and the LOCOS region 50 are separated from each other by a predetermined distance.

Figure 9A:
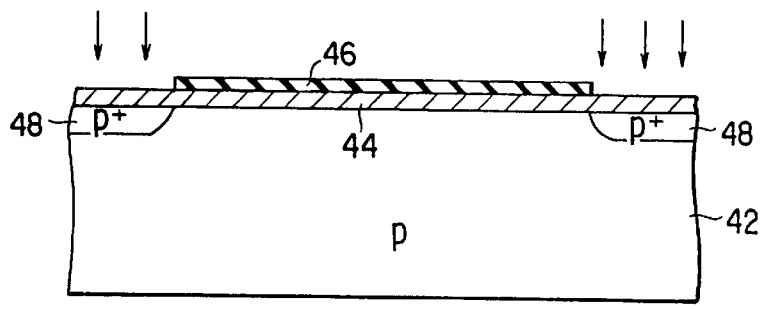
FIGS. 9A through 9E are cross sectional views of a sixth embodiment of solid state imaging apparatus according to the invention and comprising an amplifier type MOS sensor that comprises a photodiode in each unit cell, the sixth embodiment being shown in different manufacturing steps.
Figure 9B:
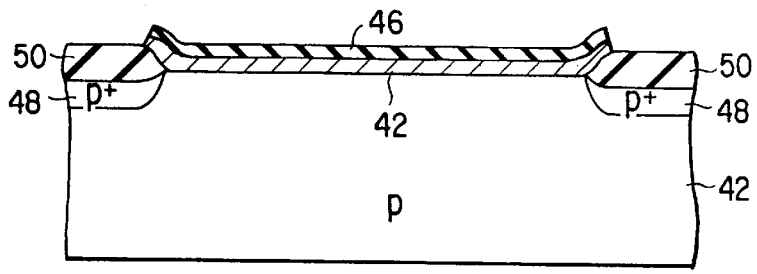

The manufacturing steps shown in FIGS. 9A and 9B are identical with those of FIGS. 4A and 4B and hence will not be described here any further.

Figure 9C:
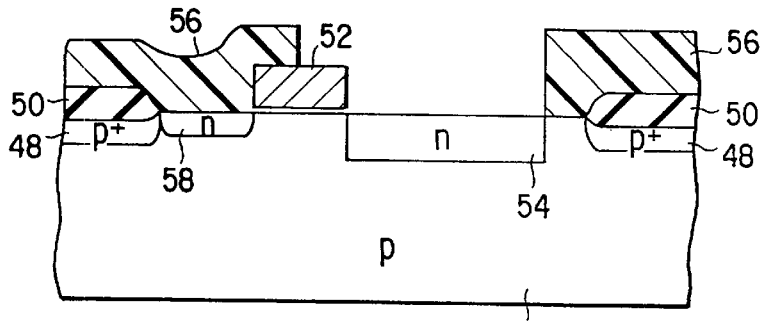
Figure 9D:
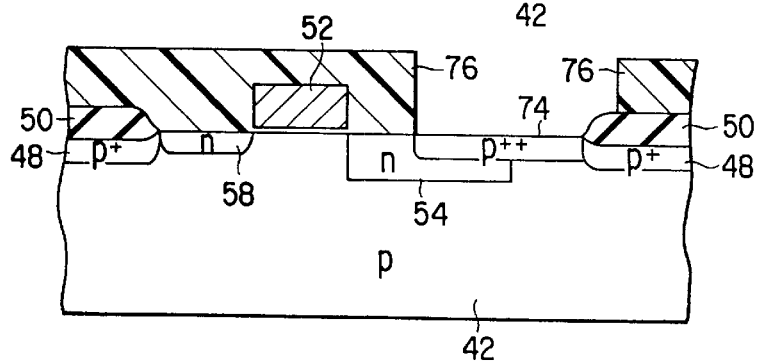

Referring to FIG. 9C, after forming a gate electrode 52 of read-out transistor on the substrate 42, resist is applied to the surface of the substrate to form a resist layer 56. Then, ions of an n-type impurity substance are implanted into the substrate, using the gate electrode 52 and the resist layer 56 as mask. After the exfoliation of the resist layer 56, the device is heat treated to diffuse the implanted ions in order to produce an n-type layer region 54 on the surface of the substrate 42. An n-type contact region 58 is formed in a similar manner.

Then, as shown in 9D, a resist layer 76 is formed by applying resist to the surface of the substrate except the area for forming a defect shielding layer 74 that is a p$^{++}$-type layer having an impurity concentration level higher than the p$^+$-type layer 48. Under this condition, ions of a p-type impurity substance are implanted into the substrate, using the resist layer 76 and part of the LOCOS region 50 as mask and then a p$^{++}$-type defect shielding layer 74 is produced in a self-aligning manner when the device is subjected to heat treatment.

Figure 9E:
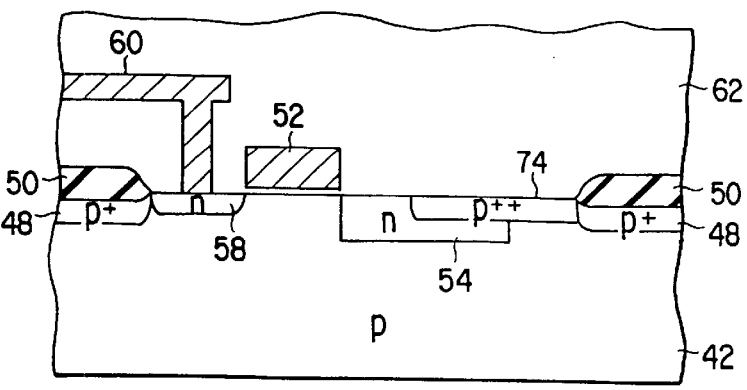

Thereafter, as shown in FIG. 9E, a wiring layer 60 is formed and connected to the contact region 58 and, at the same time, a planarizing layer 62 is formed on the substrate 42.

In this sixth embodiment, the multi-defect region at the end of the LOCOS region 50 is protected against depletion by forming a p$^{++}$-type defect shielding layer having an enhanced impurity concentration level at the end of the LOCOS region 50 and additionally by separating the n-type layer region 54 of the photodiode and the end of the LOCOS region by a predetermined distance. Thus, a leak current due to the defect at the end of the LOCOS region 50 is prevented from occurring.

Figure 10:
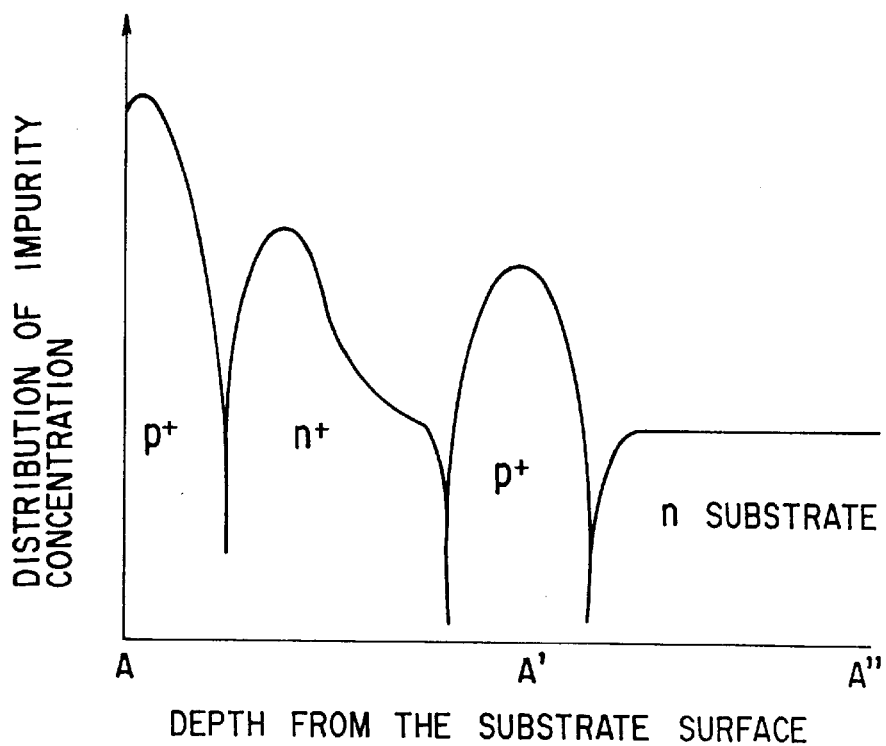
FIG. 10 is a graph schematically illustrating the relationship between the depth from the substrate surface and the impurity concentration of the photodiode of a typical solid state imaging apparatus.

The photodiode of a solid state imaging apparatus comprises a first impurity semiconductor layer (p$^+$-type layer) for forming a charge storage layer region and a second impurity semiconductor layer (n$^+$-type layer) having a conductivity type different from the first impurity semiconductor layer. If the photodiode is of a type structured to discharge saturation signals to the substrate side, it additionally comprises a third impurity semiconductor layer (p$^+$-type layer) having a conductivity type same as the first impurity semiconductor layer and arranged under the second impurity semiconductor layer (see FIG. 10).

Light that enters the substrate is subjected to photoelectric conversion principally in the depletion layer region located between the first and second impurity semiconductor layers or the depletion layer region located between the second and third impurity semiconductor layers.

Because of the potential gradient existing in the depletion layer, the signal charges between the first and second impurity semiconductor layers are collected and stored in the photodiode and, when the overall signal charge stored in the photodiode exceeds a saturation signal level that is determined as a function of the barrier of the second impurity semiconductor layer, they are discharged to the substrate side and removed.

Figure 11:
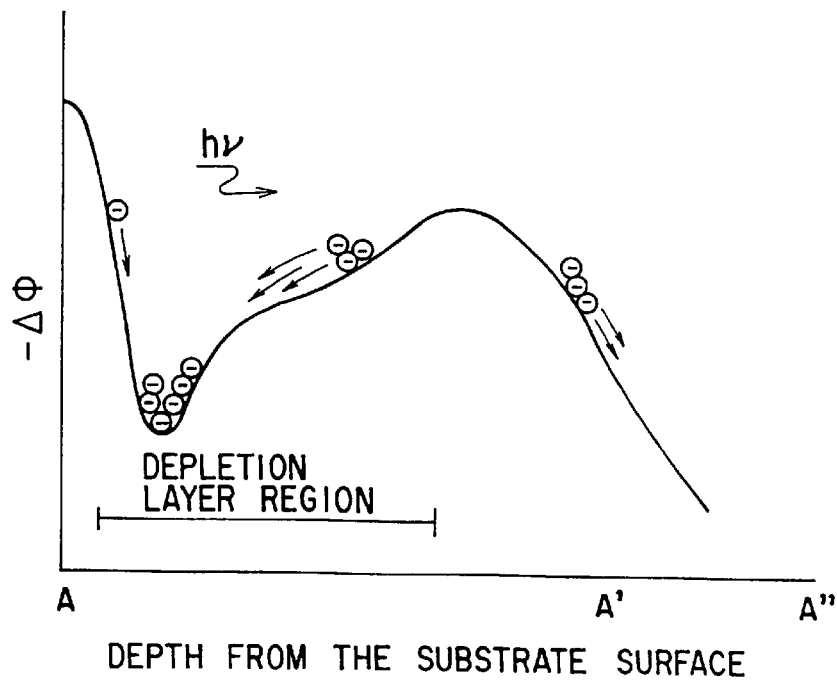
FIG. 11 is a graph schematically illustrating the relationship between the depth from the substrate surface and the electric potential of the photodiode of a typical solid state imaging apparatus.

With photodiodes having such a structure, signal charges are principally generated in the depletion layer region within the substrate and all the signal charges generated in an upper region of the signal baffler layer formed by the second impurity semiconductor layer are stored in the photodiode. When the overall signal charge exceeds a saturation level, all the excessive signals are discharged to the substrate above the baffler layer (see FIG. 11). Therefore, when very bright light strikes the substrate, the signal charges stored in the storage section reach the saturation level and would not provide output signals in response to incident light.

With photodiodes having a structure other than the above described one, including those having an adjacent overflow drain structure, the second impurity semiconductor layer that is a lower layer of the photodiode shows an impurity distribution pattern defined by the impurity introduced through the substrate surface and diffused by heat. In other words, the impurity in the second semiconductor layer that is a lower layer of the photodiode shows an impurity concentration distribution pattern that is substantially flat or mildly lowered toward the inside of the substrate (see FIG. 12).

With photodiodes having such a structure, the signals that are subjected to photoelectric conversion in the first impurity semiconductor layer located in a lower area of the photodiode are apt to be discharged into the substrate according to the gradient of impurity concentration (see FIG. 13). Therefore, most of the signals are removed without being distributed to the signal charge storage section.

Thus, there is a need for a solid state imaging apparatus having a structure that can effectively suppress the loss of signals flowing into adjacent pixels, cause the signal charges photoelectrically converted in the substrate to be stored in the storage section of the photodiode and the signal charges generated in the undepleted impurity semiconductor region in a lower area of the photodiode to be diffused and partly distributed to and stored in the storage section of the photodiode and also make what are few signal charges to be effectively led to the storage section for lower light and part of the large signal charges to be stored in the storage section by diffusing the rest of the signal charges for very bright light in order to realize a high dynamic range.

The embodiment of solid state imaging apparatus as described below is designed to realize a high dynamic range.

A seventh embodiment of the invention will now be described by referring to FIGS. 14 through 17.

Ions of an impurity substance are implanted in a semiconductor substrate that constitutes a photodiode down to a predetermined depth for forming a signal barrier layer by means of a highly accelerated ion implantation technique.

Figure 15:
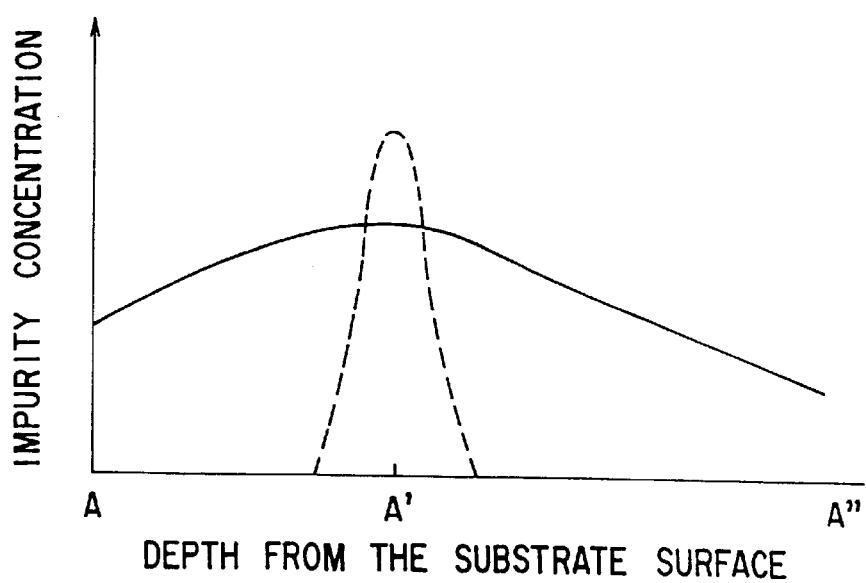
FIG. 15 is a graph showing the distribution of the impurity concentration observed in the seventh embodiment immediately after introducing an impurity and also the distribution of the impurity after the heat treatment.
Figure 16:
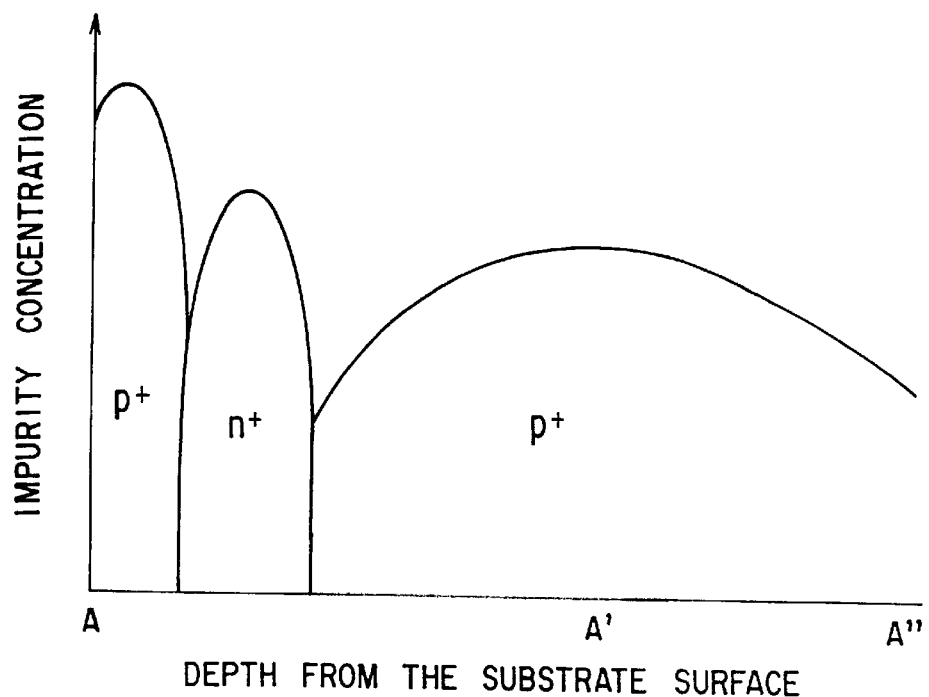
FIG. 16 is a graph schematically illustrating the relationship between the depth from the substrate surface and the impurity concentration of the photodiode of the seventh embodiment.
Figure 17:
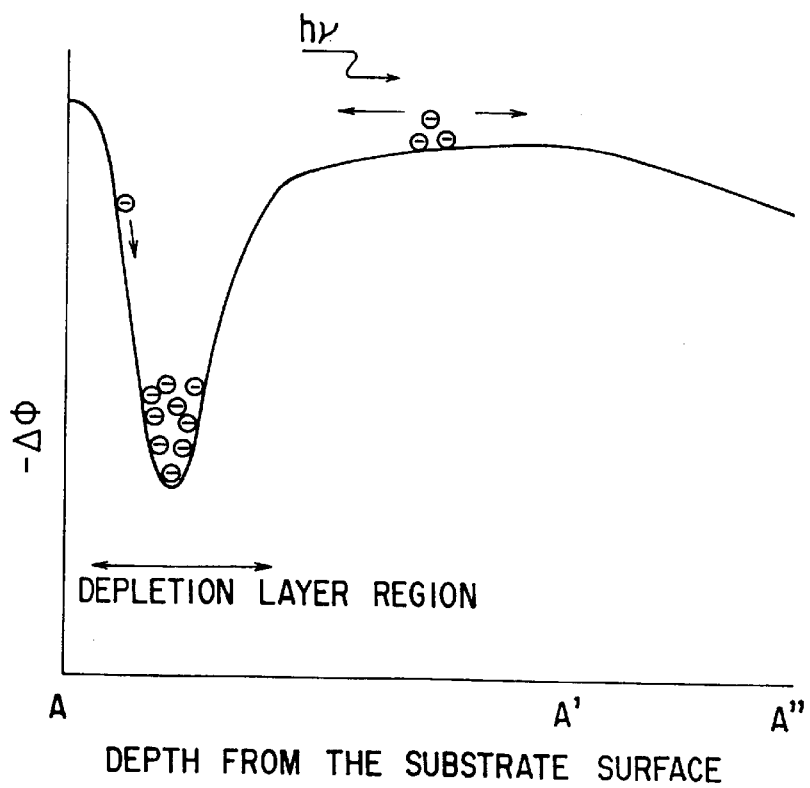
FIG. 17 is a graph schematically illustrating the relationship between the depth from the substrate surface and the electric potential of the photodiode of the seventh embodiment.

The broken line in the graph of FIG. 15 indicates the impurity distribution of the substrate immediately after implanting ions of an impurity substance. As the substrate into which the impurity substance has been introduced is heat treated, the impurity substance for forming a barrier layer comes to show a low distribution profile that gradually falls toward the signal storage section as indicated by the solid line in the graph of FIG. 15. Then, the impurity concentration of the substrate will show a distribution profile as shown in FIG. 16 when an impurity region is formed as signal storage region in the substrate.

Figure 14:
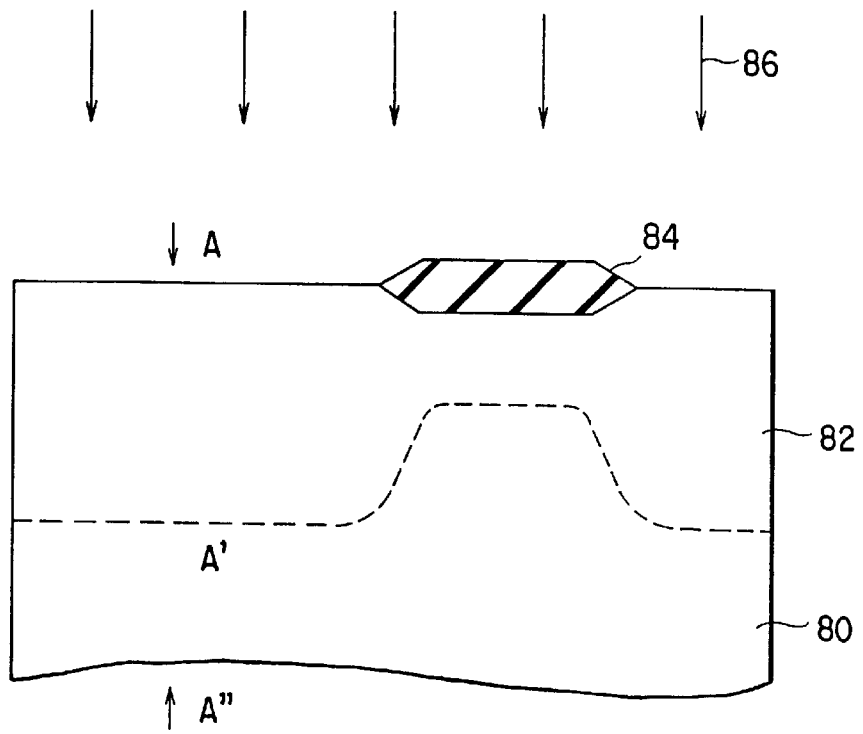
FIG. 14 is a schematic cross sectional view of a seventh embodiment of the invention, showing the layered structure of the substrate of the solid state imaging apparatus.

Referring to FIG. 14, a LOCOS layer 84 is formed as device separating layer on the surface A of the substrate 80 prior to forming a signal charge barrier layer 82 in the substrate 80. The LOCOS layer 84 has a thickness that gradually increases from the peripheral area toward the center of device separation.

After forming the LOCOS layer 84, ions of an impurity substance are implanted by means of a highly accelerated ion implantation technique 86 to produce a signal charge barrier layer deep in the substrate. Then, the LOCOS layer 84 operates as mask for decelerating accelerated ions so that the barrier layer 82 is formed at a relatively shallow level below the LOCOS layer 84.

Referring to FIG. 15 illustrating the distribution of the impurity concentration, an interdevice barrier layer 82 is formed below the LOCOS layer 84 so that signal charges are apt to be stored in the storage section and signals can be prevented from being mixed with those of adjacent pixels.

In a photodiode having an impurity concentration distribution profile as described above by referring to FIG. 16, some of the signal charges that are photoelectrically converted by incident light hv in regions under the depletion layer are distributed from depth A' as viewed from the surface A of the substrate further down to the inside A" of the substrate, while the others are distributed to the signal storage section.

Thus, in a photodiode having an impurity concentration distribution profile as shown in FIG. 16, signal charges are apt to transfer to the storage section when they are few in number, whereas they show a downward gradient toward the substrate when the substrate is irradiated with very bright light so that the storage section is less liable to be saturated with signals as excessive signal charges are diffused toward the substrate to increase the dynamic range where the number of stored signals is increased in response to the intensity of incident light.

While the LOCOS layer is used as mask for deceleration in the above described seventh embodiment, any other mask may alternatively be used for the purpose of the invention.

Now, an eighth embodiment of the invention will be described by referring to FIG. 18.

Figure 18:
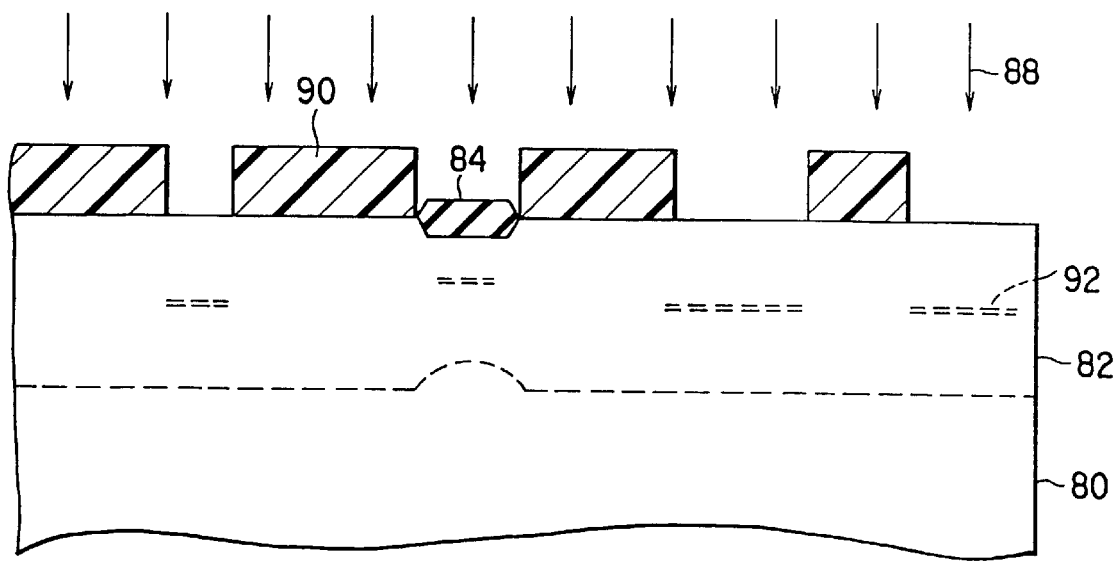
FIG. 18 is a schematic cross sectional view of an eighth embodiment of the invention, showing the layered structure which the apparatus has when highly accelerated ions are implanted.

For the embodiment of FIG. 18, scantily accelerated impurity ions are implanted selectively in an interdevice region 82 defined by a photoresist mask 90 in order to form a barrier layer in a relatively shallow area. Reference numeral 92 denotes ions implanted for interdevice separation.

Figure 19:
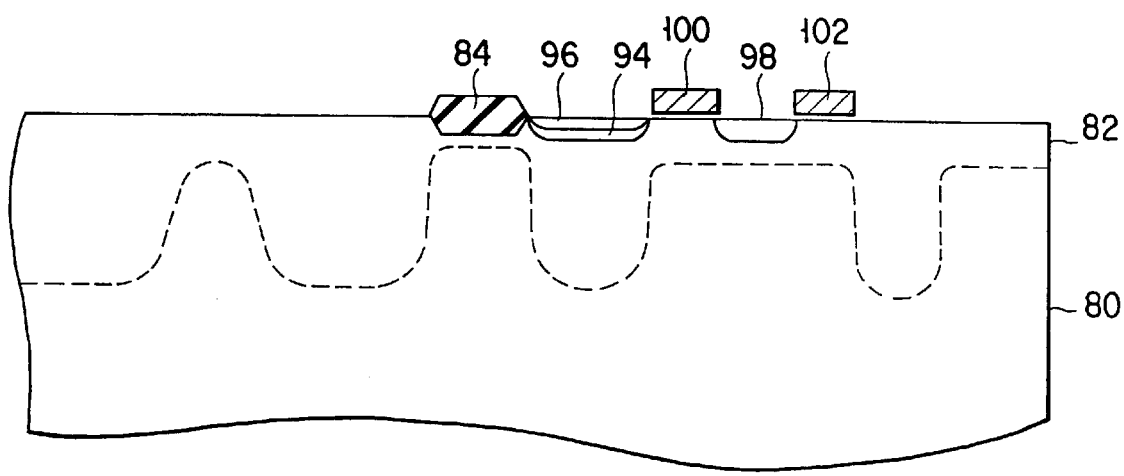
FIG. 19 is a schematic cross sectional view of the eighth embodiment of the invention, showing the layered structure which the apparatus has after highly accelerated ions have been implanted.

Thereafter, semiconductor layers 94 and 96 and a source/drain semiconductor activation region 98 are formed under the surface of the interdevice region 82, thereby forming a photodiode, as is illustrated in FIG. 19. A pair of transistor gates 100 and 102 are formed on the surface of the substrate 80.

The above arrangement gives rise to an effect same as the above described sixth embodiment. Additionally, a barrier layer can be arranged most effectively in a region separating adjacent pixels by introducing an impurity substance to a depth intermediate between the substrate surface and the bottom barrier layer.

Thus, with the seventh and eight embodiments, the signal charges that have been photoelectrically converted in a deep region of the semiconductor substrate are partly diffused in a gentle manner and transfer into an upper photodiode region that operates also as a storage section. On the other hand, any possible diffusion of the charges generated in a lower photodiode region is suppressed by the surrounding highly concentrated impurity region to prevent signals from flowing into adjacent pixels to become lost.

In the current attempt form down-sizing the cells of amplifier type solid state imaging apparatus, efforts are being made to reduce the number of MOS transistors, although the existence of a read-out transistor can frustrate the attempt of down-sizing. Alternatively, the degradation of the sensitivity of a photodiode may be prevented by eliminating the use of a read-out transistor.

A ninth embodiment of the invention is configured to eliminate the use of a read-out transistor. This embodiment is realized by carrying out a well diffusion process after the operation of highly accelerated ion implantation.

Figures 20A, 20B:
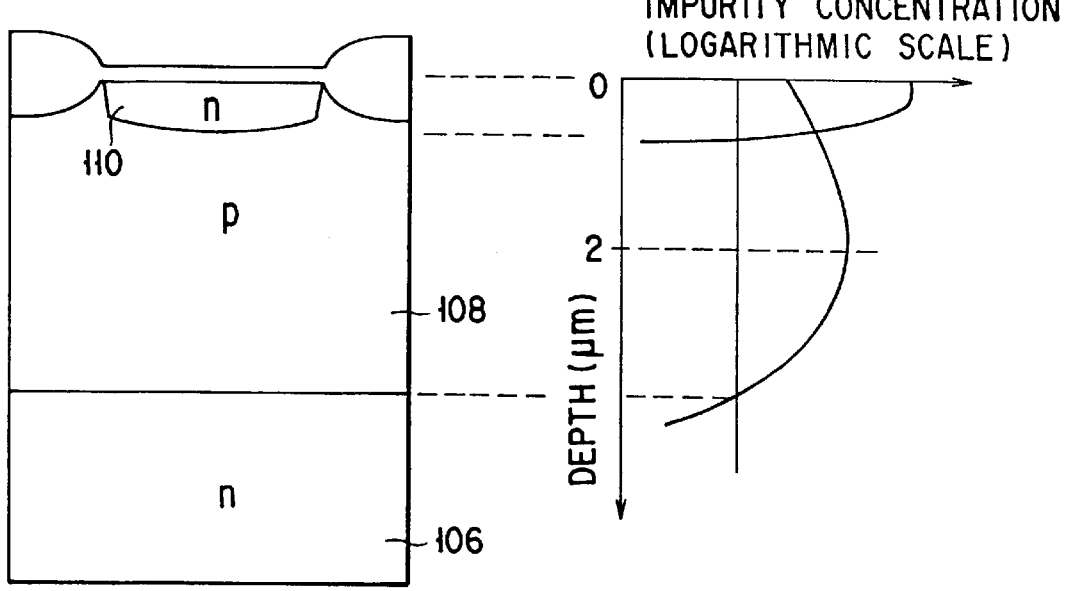
FIG. 20A is a schematic cross sectional view of a ninth embodiment of the invention, showing the layered structure of the substrate of the solid state imaging apparatus.
FIG. 20B is a graph showing the distribution of the impurity concentration in the substrate of FIG. 20A.

FIG. 20A is a schematic view of the ninth embodiment of solid state imaging apparatus according to the invention, showing its layered structure, and FIG. 20B is a graph showing how the impurity concentration is distributed in the substrate of the embodiment of FIG. 20A.

A potential barrier is provided to prevent electrons from being discharged to the substrate side and avoid any possible degradation in the sensitivity of the photodiode due to the diffusion potential gradient of the p-well 108 on the n-type substrate 106. This potential barrier is formed by placing the portion of the p-well 108 having the highest concentration at the position located deepest from the surface of the substrate. The depth of the position of the portion of the p-well having the highest concentration is at least 2 $\mu$m from the substrate surface (see FIG. 20B). In FIG. 20A, reference numeral 110 denotes an n-type diffusion layer.

Thus, the portion of the p-well 108 having the highest concentration is located at the position deepest from the surface of the substrate and a diffusion potential gradient that can collect photoelectrons at the surface side of the substrate is formed from there up to the substrate surface. Therefore, the probability with which photoelectrons are discharged to the substrate side is reduced and, to the contrary, the probability with which photoelectrons are discharged to the photodiode at the surface of the substrate is raised to consequently improve the sensitivity of the photodiode.

Note that photoelectric conversion of visible light is carried out in an area with a depth less than about 2 μm in the (Si) substrate and, therefore, the portion of the p-well 108 having the highest concentration should be placed at a position at least 2 μm deep in the substrate.

Figure 2:
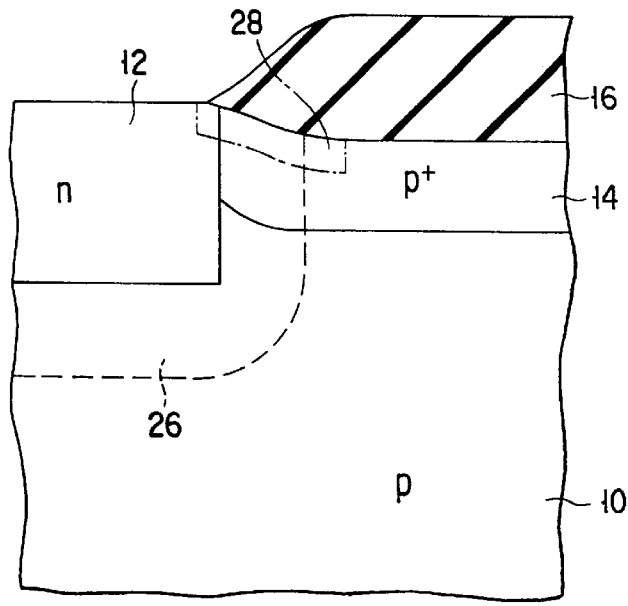
FIG. 2 is an enlarged view showing the boundary area of the photodiode and the LOCOS region of FIG. 1.
Figures 21A, 21B:
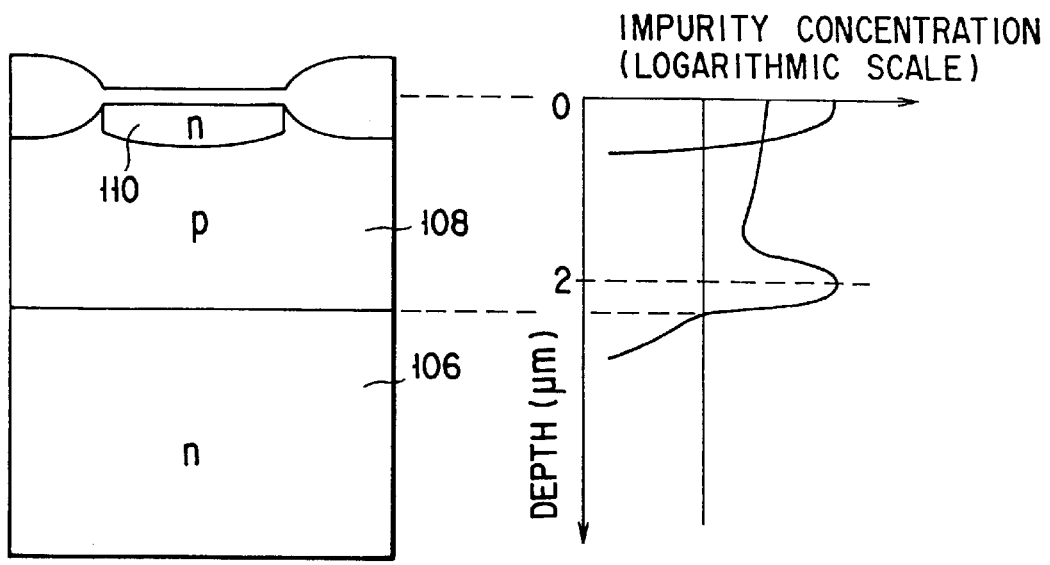
FIG. 21A is a schematic cross sectional view of a tenth embodiment of the invention, showing the layered structure of the substrate of the solid state imaging apparatus.
FIG. 21B is a graph showing the distribution of the impurity concentration in the substrate of FIG. 21A.

FIG. 21A is a schematic view of a tenth embodiment of solid state imaging apparatus according to the invention, showing its layered structure, and FIG. 21B is a graph showing how the impurity concentration is distributed in the substrate of the embodiment of FIG. 2.

In this tenth embodiment, after forming an ordinary well, a potential barrier is formed against photoelectrons at the deepest position by means of MeV ion implantation. With this arrangement, the probability with which photoelectrons are discharged to the n-type substrate side is reduced to improve the sensitivity of the photodiode.

This VOD structure for discharging signal charges to the substrate side makes the provision of a read-out transistor unnecessary. Unlike the VOD structure of a CCD, signal charges are discharged by manipulating the potential of a detecting section by means of a cell address capacitor.

Figure 22:
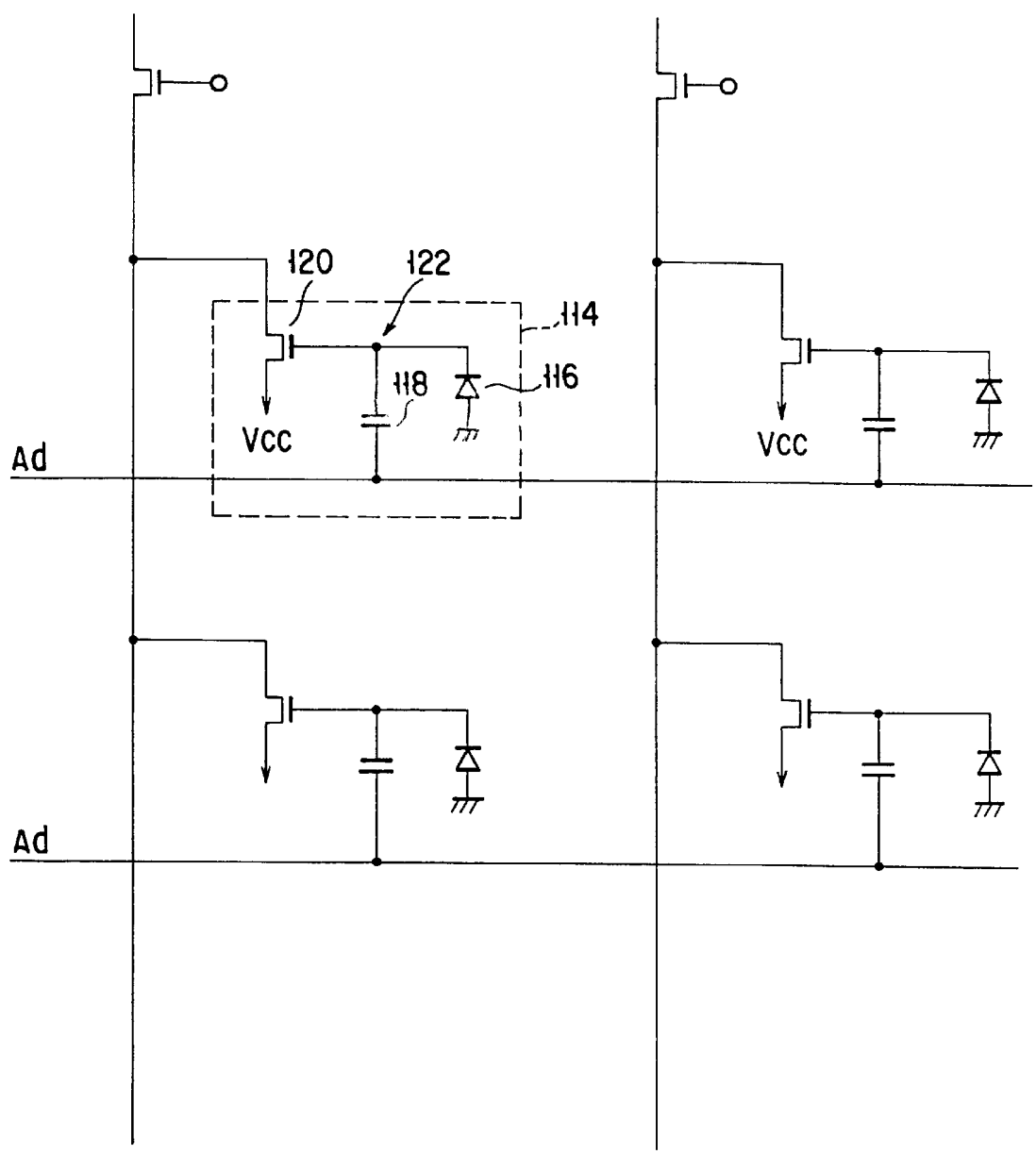
FIG. 22 is a schematic circuit diagram of a cell having a structure adapted for discharging reset charges to the substrate side.

FIG. 22 is a circuit diagram that can be used for the cell section having a structure for discharging charges to the substrate side. This circuit will be described by referring to FIGS. 23A through 23C, showing the electric potential of the detecting section.

Figure 23A:
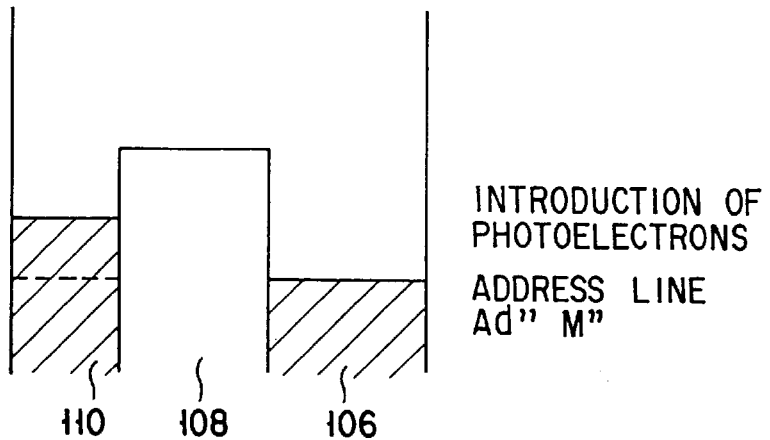
FIGS. 23A through 23C are graphs showing the electric potential of the detecting section of FIG. 22.
Figure 23B:
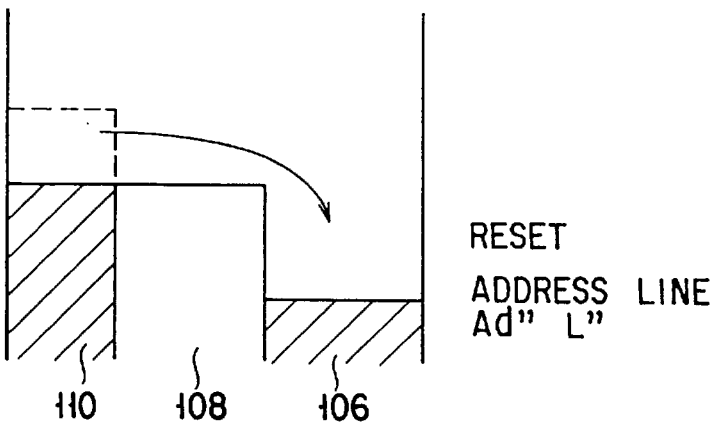
Figure 23C:
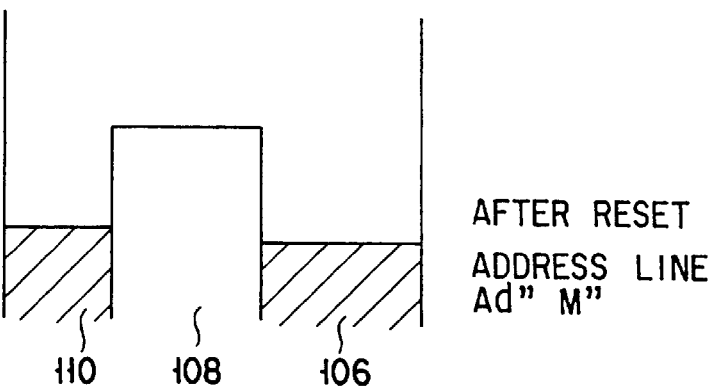

Referring to FIGS. 23A through 23C, an unit cell 114 comprises a photodiode 116, a capacitor 118 and a transfer transistor 120. The capacitor 118 is connected between the gate of the transfer transistor 120 and an address line Ad. Reference numeral 122 denotes a detecting section.

The relationship among the diffusion layer 110, the p-well 108 and the substrate 106 is illustrated in FIGS. 23A through 23C in terms of electric potential, of which FIG. 23A shows the electric potentials of these components when no photoelectrons are introduced into the detecting section 122 of FIG. 22. The address line Ad has to be brought to level "L" to reset this relationship. Since the detecting section 122 is reversely biased relative to the p-well 108 under this condition, electrons are swept out to the n-type substrate 106 by way of the p-well 108. Thereafter, the electric potential of the address line Ad is restored to complete a reset operation (FIG. 23C).

Since the provision of a read-out transistor is unnecessary with the above arrangement, the sensitivity of the photodiode is improved and the cell can be further down-sized.

Note that the above described first through tenth embodiments relate to an amplifier type MOS sensor that can be used for a solid state imaging apparatus according to the invention. A MOS type solid state imaging apparatus according to the invention and comprising a MOS sensor of the above described type is remarkable in that it requires only small power and low voltages, shows a good S/N ratio and operates with a single power source. Now, various systems that can be realized by utilizing a MOS type solid state imaging apparatus according to the invention will be described.

Figure 24:
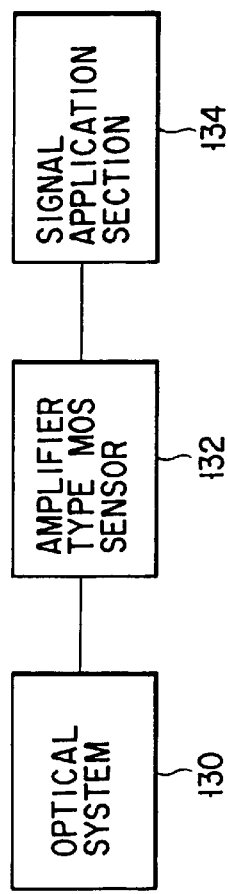
FIG. 24 is a schematic block diagram of an eleventh embodiment of the invention that is a typical picture reading system comprising an amplifier type MOS sensor according to the invention.

FIG. 24 is a schematic block diagram of an eleventh embodiment of the invention that is a picture reading system comprising an amplifier type MOS sensor according to the invention as an image detecting section.

Referring to FIG. 24, this video reading system comprises an optical system 130, an amplifier type MOS sensor 132 and a signal application section 134.

The optical system 130 operates to lead an optical image to the amplifier type MOS sensor 132 and typically comprises components selected from lenses, prisms, pinholes, dichroic mirrors, focusing optical fibers, concave mirrors, convex mirrors, color filters, shutter mechanisms, iris mechanisms and other optical devices according to its application.

The amplifier type MOS sensor 132 converts the optical image led in by the optical system 130 into a set of video signals, each of which reflects the quantity of light of the spot of the image it represents. If the video reading system involves a video camera, the signal application section 134 operates to transform the video signals transmitted from the MOS sensor 132 into composite signals conforming to the PAL system, the NTSC system or some other appropriate system.

The MOS sensor 132 can be driven to operate by means of a single power source and typically comprises photodiodes in its light receiving section for converting light into electric signals. Photodiodes correspond to pixels that are arranged into a matrix. In order to down-size each pixel, each photodiode is made to occupy a small area and hence its output power is small. Thus, an amplifier (transistor) is arranged to amplify the small output of the photodiode in correspondence to the pixel. However, the amplifier (transistor) generates noise when a signal passes therethrough (a noise component that is inevitable because of the intrinsic characteristic of an amplifying transistor). This noise is canceled to single out the signal component by carrying out a series of operations including resetting the output of each of the photodiodes of the MOS sensor 132, retaining the output signal (noise component) of the amplifying transistor and canceling the retained output signal (noise component) and the output of the amplifier (transistor) before or after the resetting operation ("signal component"+"noise component").

The MOS sensor 132 can produce an output that is free from 1/f noise and has an output current level of 1 μA or more with the voltage amplitude of the output signal less than 10 mV. Additionally, the dynamic range of the output of this MOS sensor 132 can be improved to 70 dB or more that corresponds to the dynamic range of CCD sensor. With an appropriate signal processing operation, the dynamic range can be further improved to 90 dB that corresponds to the dynamic range of silver salt film.

As a result, various video systems can be realized by utilizing a highly sensitive amplifier type MOS sensor as an imaging device that requires only a single power source to achieve a reduced power consumption level and a low voltage level and shows an excellent S/N ratio.

Now, a twelfth embodiment of the invention will be described.

This twelfth embodiment is realized by applying an amplifier type MOS sensor according to the invention to a still camera.

Figure 25:
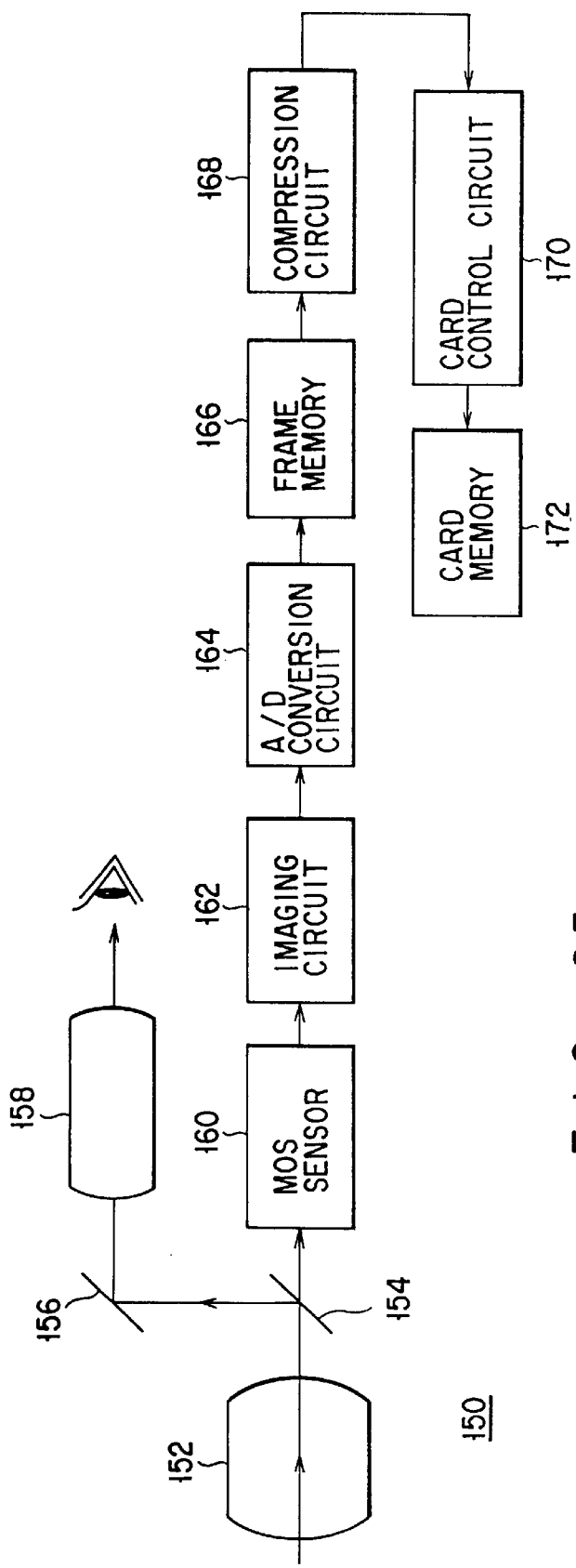
FIG. 25 is a schematic block diagram of a still camera comprising a MOS sensor according to the invention.

FIG. 25 is a schematic block diagram of a still camera comprising a MOS sensor according to the invention.

Referring to FIG. 25, the still camera 150 comprises an optical system 152 typically including a lens system and an iris necessary for shooting a scene, a mirror 154 for guiding the image obtained by the optical system 152, another mirror for leading the reflected light from the mirror 154 to a finder 158, a MOS sensor 160 located behind the mirror 154 at a position where the image picked up by the optical system is focused, an imaging circuit 162 for reading the video signals for different primary colors obtained from the MOS sensor 160, an A/D conversion circuit 164 for converting the read signals into digital signals, a frame memory 166 for retaining the converted digital signals on a frame by frame basis, a compression circuit 168 for compressing the retained digital signals also on a frame by frame basis, a memory card 172 for storing the video data and a card control circuit 170 for controlling the operation of writing the compressed video data from the compression circuit 168 into the memory card 172.

The mirror 154 is retractably arranged on the optical path connecting the optical system 152 and the focal plane of the MOS sensor 160. It distributes the image picked up by the optical system 152 to the finder 158 by way of the mirror-156 when it is located on the optical path, whereas it operates as a shutter that causes the image picked up by the optical system 152 to be focused on the focal plane of the MOS sensor 160 when it is held to its retracted position.

With a still camera having the above described configuration, when a scene is shot by the camera as the shutter button (not shown) is depressed, an image thereof is picked up by the optical system 152 an and focused in the MOS sensor 160 by way of the mirror 154. The MOS sensor 160 is a solid state imaging apparatus according to the invention and, as the image picked up by the optical system 152 is focused, the optical image is transformed into an electric signal representing the quantity of light of the optical image on a pixel by pixel basis. In order to reproduce a color image, the MOS sensor 160 is provided on the focal plane side thereof with a color filter array for providing each pixel with a color filter of red, green or blue.

In the imaging circuit 162, the electric signal produced from the MOS sensor 160 is divided into signals for red, green and blue before they are transmitted to the A/D conversion circuit 164, where the electric signals for red, green and blue coming from the imaging circuit 162 are converted into digital signals, which are then temporarily retained in the frame memory on a frame by frame basis.

The digital signals retained by the frame memory 166 are compressed by the compression circuit 168 on a frame by frame basis and then transmitted to the card control circuit 170, which card control circuit 170 controls the operation of the memory card 172 for storing the compressed video data.

Thus, each time the shutter button of the still camera is depressed, a still picture is taken by the camera and the signals representing the picture is compressed for the frame and stored in the memory card 172. Note that the memory card 172 is removably arranged in the camera. The pictures stored in the memory card 172 are then fed to a reading/reproducing device (not shown) that decompresses the compressed image data for each of the pictures so that the restored image may be displayed on the screen of a monitoring unit or the image data may be sent to a hard copy producing unit such as a video printer to reproduce the image in the form of a hard copy.

Thus, this second embodiment is a highly sophisticated high performance compact still camera that can take a number of pictures successively within a second but requires only a single power source to achieve a reduced power consumption level and a low voltage level and shows an excellent S/N ratio. In other words, the fixed pattern noise component that used to be a serious problem of known MOS sensors can be canceled in a short period of time in this embodiment to produce high quality pictures with a good S/N ratio.

It will be appreciated that the present invention contemplates not only video reading apparatus and still cameras as described above but also video reading apparatus to be used in video cameras, facsimile machines and other copying machines.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a solid state imaging apparatus comprising:

forming for each unit cell a first impurity layer in a surface area of a substrate of a first conductivity type by implanting ions of an impurity of a first conductivity type into said substrate to an impurity concentration level higher than that of said substrate, using a silicon nitride film formed on the substrate as a mask;

forming a device separation region on said first impurity layer;

forming a second impurity layer of a second conductivity type in a surface area of said substrate and a third impurity layer of the second conductivity type in another surface area of said substrate separated from said device separation region by a predetermined distance by implanting ions of an impurity of the second conductivity type different from said first conductivity type, an electrode formed on said substrate and a resist layer formed on said substrate being used as a mask in forming said second impurity layer, and said electrode and said device separation region being used as a mask in forming said third impurity layer; and forming a wiring layer on said second impurity layer after removing said resist layer.

2. A method of manufacturing a solid state imaging apparatus comprising:

forming for each unit cell a first impurity layer in a surface area of a substrate of a first conductivity type by implanting ions of an impurity of a first conductivity type into said substrate to an impurity concentration level higher than that of said substrate, using a silicon nitride film formed on the substrate as a mask;

forming a device separation region on said first impurity layer;

forming a second impurity layer of a second conductivity type in a surface area of said substrate and a third impurity layer of the second conductivity type in another surface area of said substrate separated from said device separation region by a predetermined distance by implanting ions of an impurity of the second conductivity type different from said first conductivity type, using an electrode formed on said substrate and a resist layer formed on said substrate and said device separation region as a mask; and forming a wiring layer on said second impurity layer after removing said resist layer;

the distance L separating the closest opposite ends of said first impurity layer and the device separation region and the depth Y of said first impurity layer from the substrate surface showing the following relationship;

Y<L tan θ where θ is the angle with which the defect generated at the end of said device separation region extends relative to the substrate surface.

3. A method according to claim 2, wherein said angle θ is about 59°.

4. A method of manufacturing a solid state imaging apparatus comprising:

forming for each unit cell a first impurity layer in a surface area of a substrate of a first conductivity type by implanting ions of an impurity of a first conductivity type into said substrate to an impurity concentration level higher than that of said substrate, using a silicon nitride film formed on the substrate as a mask;

forming a device separation region on said first impurity layer;

forming a second impurity layer of a second conductivity type in a surface area of said substrate and a third impurity layer of the second conductivity type in another surface area of said substrate adjacent to said device separation region by implanting ions of an impurity of the second conductivity type different from said first conductivity type, using an electrode formed on said substrate, a resist layer formed on said substrate and said device separation region as a mask;

forming a fourth impurity layer by implanting ions of said impurity of the first conductivity type into part of the surface area of said third impurity layer adjacent to said first impurity layer to an impurity concentration level higher than that of the first impurity layer, using the resist layer formed on said substrate and said device separation region as a mask with a self-alignment manner; and forming a wiring layer on said second impurity layer after removing said resist layer.

5. A method of manufacturing a solid state imaging apparatus comprising:

forming for each unit cell a first impurity layer in a surface area of a substrate of a first conductivity type by implanting ions of an impurity of a first conductivity type into said substrate to an impurity concentration level higher than that of said substrate, using a silicon nitride film formed on the substrate as a mask;

forming a device separation region on said first impurity layer;

forming a second impurity layer of a second conductivity type in a surface area of said substrate and a third impurity layer of the second conductivity type in another surface area of said substrate adjacent to said device separation region by implanting ions of an impurity of the second conductivity type different from said first conductivity type, using an electrode formed on said substrate, a resist layer formed on said substrate and said device separation region as a mask;

forming a fourth impurity layer by implanting ions of said impurity of the first conductivity type into a surface area of said third impurity layer to an impurity concentration level higher than that of the first impurity layer, using the electrode formed on said substrate, the resist layer formed on said substrate and said device separation region as mask with a self-alignment manner; and forming a wiring layer on said second impurity layer after removing said resist layer.

6. A method of manufacturing a solid state imaging apparatus comprising:

forming for each unit cell a first impurity layer in a surface area of a substrate of a first conductivity type by implanting ions of an impurity of a first conductivity type into said substrate to an impurity concentration level higher than that of said substrate, using a silicon nitride film formed on the substrate as a mask;

forming a device separation region on said first impurity layer;

forming a second impurity layer of a second conductivity type in a surface area of said substrate and a third impurity layer of the second conductivity type in another surface area of said substrate separated from said device separation region by a predetermined distance by implanting ions of an impurity of the second conductivity type different from said first conductivity type, using an electrode formed on said substrate, a resist layer formed on said substrate and said device separation region as a mask;

forming a fourth impurity layer by implanting ions of said impurity of the first conductivity type into a surface area of said third impurity layer and a surface area of said substrate adjacent to said first impurity layer to an impurity concentration level higher than that of the first impurity layer, using the electrode formed on said substrate, the resist layer formed on said substrate and said device separation region as a mask with a self-alignment manner; and forming a wiring layer on said second impurity layer after removing said resist layer.

7. A method of manufacturing a solid state imaging apparatus comprising:

forming for each unit cell a first impurity layer in a surface area of a substrate of a first conductivity type by implanting ions of an impurity of a first conductivity type into said substrate to an impurity concentration level higher than that of said substrate, using a silicon nitride film formed on the substrate as mask;

forming a second impurity layer by implanting ions of the impurity of said first conductivity type into a surface area of said substrate adjacent to said first impurity layer to a concentration level higher than that of said first impurity layer, using said silicon nitride film and a resist layer formed on part of said first impurity layer as a mask;

forming a device separation region on said first impurity layer;

forming a third impurity layer of a second conductivity type in a surface area of said substrate and a fourth impurity layer of the second conductivity type in another surface area of said substrate adjacent to said device separation region by implanting ions of an impurity of the second conductivity type different from said first conductivity type, using an electrode formed on said substrate, a resist layer formed on said substrate and said device separation region as a mask with a self-alignment manner; and forming a wiring layer on said second impurity layer after removing said resist layer.

8. A method of manufacturing a solid state imaging apparatus comprising:

forming for each unit cell a first impurity layer in a surface area of a substrate of a first conductivity type by implanting ions of an impurity of a first conductivity type into said substrate to an impurity concentration level higher than that of said substrate, using a silicon nitride film formed on the substrate as a mask;

forming a device separation region on said first impurity layer;

forming a second impurity layer of a second conductivity type in a surface area of said substrate and a third impurity layer of the second conductivity type in another surface area of said substrate separated from said device separation region by a predetermined distance by implanting ions of an impurity of the second conductivity type different from said first conductivity type, using an electrode formed on said substrate, a resist layer formed on said substrate and said device separation region as a mask;

forming a fourth impurity layer by implanting ions of said impurity of the first conductivity type into part of the surface area of said third impurity layer adjacent to said first impurity layer to an impurity concentration level higher than that of the first impurity layer, using the resist layer formed on said substrate and said device separation region as a mask with a self-alignment manner; and forming a wiring layer on said second impurity layer after removing said resist layer.

* * * * *